United States Patent
Pan et al.

(10) Patent No.: US 10,965,114 B2
(45) Date of Patent: Mar. 30, 2021

(54) METHOD AND APPARATUS FOR SUPPRESSING IMPACT OF COMPENSATOR ON LINE DISTANCE PROTECTION

(71) Applicants: NR Electric Co., Ltd., Jiangsu (CN); NR Engineering Co., Ltd., Jiangsu (CN)

(72) Inventors: Lei Pan, Jiangsu (CN); Jie Tian, Jiangsu (CN); Yunlong Dong, Jiangsu (CN); Yu Lu, Jiangsu (CN); Ruhai Huang, Jiangsu (CN); Chongxue Jiang, Jiangsu (CN); Jiang Lu, Jiangsu (CN); Baoshun Zhang, Jiangsu (CN); Defeng Qiu, Jiangsu (CN); Hua Xie, Jiangsu (CN)

(73) Assignees: NR ELECTRIC CO., LTD., Jiangsu (CN); NR ENGINEERING CO., LTD., Jiangsu (CN)

( * ) Notice: Subject to any disclaimer, the term of this patent is extended or adjusted under 35 U.S.C. 154(b) by 0 days.

(21) Appl. No.: 16/617,124

(22) PCT Filed: May 22, 2018

(86) PCT No.: PCT/CN2018/087794
§ 371 (c)(1),
(2) Date: Nov. 26, 2019

(87) PCT Pub. No.: WO2018/214864
PCT Pub. Date: Nov. 29, 2018

(65) Prior Publication Data
US 2020/0185901 A1    Jun. 11, 2020

(30) Foreign Application Priority Data

May 26, 2017    (CN) .......................... 201710385363.5

(51) Int. Cl.
*H02H 1/00* (2006.01)
*H02H 9/00* (2006.01)
(Continued)

(52) U.S. Cl.
CPC ........ *H02H 1/0007* (2013.01); *H02H 1/0092* (2013.01); *H02H 9/00* (2013.01);
(Continued)

(58) Field of Classification Search
USPC ...................................... 361/62–69
See application file for complete search history.

(56) References Cited

U.S. PATENT DOCUMENTS

| 6,028,754 A * | 2/2000 | Guzman-Casillas .... H02H 3/40 361/115 |
| 6,034,592 A * | 3/2000 | Jurisch .................. G01R 27/16 324/509 |
| 6,661,630 B1 * | 12/2003 | Ahn ........................ H02H 3/40 361/78 |

FOREIGN PATENT DOCUMENTS

| CN | 104967104 A | 10/2015 |
| CN | 105207186 A | 12/2015 |

(Continued)

OTHER PUBLICATIONS

Zhang, Y., "Unified Power Flow Controller and Its Effects on Distance Protection," *Science-Engineering (B), China Master's Theses Full-Text Database*), No. 4-15 Aug. 2005, ISSN: 1671-6779, pp. 36-37.

*Primary Examiner* — Danny Nguyen
(74) *Attorney, Agent, or Firm* — Masuvalley & Partners

(57) ABSTRACT

A method and apparatus for suppressing the impact of a compensator on line distance protection is provided, wherein the method comprises: obtaining a first current of a line connected to a compensator or series converters in the compensator, and a first voltage of a bus connected to the
(Continued)

compensator or the line connected to the compensator; exiting the series converters and series transformers if the first current is greater than a preset current threshold and a duration is greater than a first preset time threshold; exiting the series converters and the series transformers if the first voltage is less than or equal to a preset voltage threshold and duration is greater than a second preset time threshold set the output voltage of the series converters to zero, and if a second current of an element corresponding to the first current meets conditions which the first current needs to meet; and otherwise, canceling the setting of the output voltage of the series converters to zero and obtaining a first current if a second voltage of the line corresponding to the first voltage is greater than the preset voltage threshold and the duration is greater than a third preset time threshold.

19 Claims, 8 Drawing Sheets

(51) Int. Cl.
*H02J 3/18* (2006.01)
*H02H 7/26* (2006.01)
*H02H 3/26* (2006.01)
*G01R 31/40* (2020.01)
*H02H 3/00* (2006.01)

(52) U.S. Cl.
CPC ............ *H02J 3/1814* (2013.01); *G01R 31/40* (2013.01); *H02H 3/006* (2013.01); *H02H 3/26* (2013.01); *H02H 7/26* (2013.01); *H02H 7/261* (2013.01)

(56) References Cited

FOREIGN PATENT DOCUMENTS

| | | |
|---|---|---|
| CN | 105826908 A | 8/2016 |
| CN | 107026432 A | 8/2017 |
| CN | 107069683 A | 8/2017 |
| CN | 107240908 A | 10/2017 |
| CN | 107240909 A | 10/2017 |
| JP | H 0620566 A | 1/1994 |

* cited by examiner

METHOD AND APPARATUS FOR SUPPRESSING IMPACT OF COMPENSATOR ON LINE DISTANCE PROTECTION

RELATED APPLICATIONS

This application is the U.S. National Phase of and claims priority to International Patent Application No. PCT/CN2018/087794, International Filing Date May 22, 2018, entitled Method And Apparatus For Suppressing Impact Of Compensator On Line Distance Protection; which claims priority to Chinese Application No. 201710385363.5 filed May 26, 2017; both of which are incorporated herein by reference in their entireties.

TECHNICAL FIELD

The present invention relates to a technique for suppressing the impact of a power electronic device on a distance protection line in the field of power systems, and more particularly to a method and apparatus for suppressing the impact of a compensator on line distance protection.

BACKGROUND

With the rapid development of interconnect technology of power systems, power systems for long-distance transmission have been widely used. In the operation process of the long-distance power systems, it is easily affected by factors such as environment and load demand, and system fluctuations occur, resulting in the problem of degraded performance on system stability control performance, AC/DC hybrid power grid coordination, and power flow control capability. In the prior art, control devices such as a Static Synchronous Series Compensator (SSSC), a Unified Power Flow Controller (UPFC), an Interline Power Flow Controller (IPFC) and a convertible static compensator are used to solve the above technical problems.

At present, the literature on the impact of static synchronous series compensator or the connection with UPFC on AC protection in the prior art includes: "Unified power flow controller and its impact on relay protection", "Unified power flow controller and its impact on distance protection", "Research on adaptive distance protection with unified power flow controller circuit"; and patent documents include: patent document with application No. CN201510732288.6 and the title of the invention of "a distance protection method for transmission lines with unified power flow controller"; patent document with application No. CN201610309848.1 and the title of the invention of "a fast distance protection method and device for transmission lines containing UPFC"; patent document with application No. CN201510371762.7 and the title of the invention of "a current transient direction protection with a unified power flow controller transmission line based on pattern recognition", and patent document with application No. CN201510371647.X and the title of the invention of "a transient energy protection method for a transmission line with a unified power flow controller".

However, the above existing literature mainly optimizes the protection function of line protection apparatus for line distance protection according to the working principle and characteristics of SSSC, UPFC, IPFC or convertible static compensator, but does not consider the control protection response characteristics of apparatus such as SSSC, UPFC, IPFC or convertible static compensator when power system fails, which reduce the distance protection performance of the line protection apparatus on the transmission line in the power system, and have no industrial practicability.

SUMMARY

In order to solve the above technical problem, the embodiments of the present invention are intended to provide a method and apparatus for suppressing the impact of a compensator on line distance protection, and solving the problem that the prior art affects the protection performance of the line protection apparatus, and ensuring the performance of the line protection apparatus for distance protection of the line, ensuring the safe and stable operation of the power system, and ensuring the industrial applicability.

To achieve the above objective, the technical solutions of embodiments of the present invention are described as follows:

A method of suppressing the impact of a compensator on line distance protection, the method comprising:

acquiring a current of a line connected to the compensator or a series converter in the compensator to obtain a first current; wherein the compensator is configured to control the current of a line connected to the compensator, the compensator comprising a static synchronous series compensator, a unified power flow controller, an interline power flow controller, and a convertible static compensator;

acquiring a voltage of a bus connected to the compensator or the line connected to the compensator to obtain a first voltage;

comparing a relationship between the first current and a preset current threshold;

comparing a relationship between the first voltage and a preset voltage threshold;

exiting the series converter and a series transformer, if the first current is greater than the preset current threshold, and a first duration is greater than a first preset time threshold; wherein the series transformer is a device in the compensator, the first duration is a duration in which the first current is greater than the preset current threshold;

acquiring a voltage of the bus connected to the compensator or the line connected to the compensator to obtain a first voltage, if the first current is less than or equal to the preset current threshold, or if the first current is greater than the preset current threshold and the first duration is less than or equal to the first preset time threshold;

comparing a relationship between the first voltage and a preset voltage threshold;

setting an output voltage of the series converter to be zero, and acquiring a current of the component corresponding to the first current to obtain a second current, if the first voltage is less than or equal to the preset voltage threshold and the second duration is greater than the second preset time threshold; wherein the second duration is a duration in which the first voltage is less than or equal to the preset voltage threshold;

exiting the series converter and the series transformer if the second current is greater than the preset current threshold, and a third duration is greater than the first preset time threshold; wherein the third duration is a duration in which the second current is greater than the preset current threshold;

acquiring a voltage of a line corresponding to the first voltage to obtain a second voltage, if the second current is less than or equal to the preset current threshold, or if the second current is greater than the preset current threshold and the third duration is less than or equal to the first preset time threshold;

canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; wherein the fourth duration is a duration in which the second voltage is greater than the duration of the preset voltage threshold.

Optionally, the exiting the series converter and the series transformer comprises:

locking the series converter and triggering a fast bypass in parallel with said series transformer to be turned on; and closing the mechanical bypass switch in parallel with the series transformer.

Optionally, the method further comprises the following steps after exiting the series converter and the series transformer:

acquiring the current and voltage of the line connected to the compensator when a preset time comes;

enabling the series converter and the series transformer, if the current of the line connected to the compensator is within a preset current range, and the voltage of the line connected to the compensator is within a preset voltage range.

Optionally, the method further comprises the following steps after acquiring the current of a component corresponding to the first current to obtain a second current:

sending a first execution instruction to a line protection apparatus if the second current is less than or equal to the preset current threshold, or if the second current is greater than the preset current threshold and the third duration is less than or equal to the first preset time threshold; wherein the line protection apparatus is configured to protect the line connected to the compensator, and the first execution instruction is used to instruct the line protection apparatus to update a set value of the distance protection impedance of the line connected to the compensator according to a first preset rule;

acquiring the second voltage after a preset time period from sending the first execution instruction;

sending a second execution instruction to the line protection apparatus if the second voltage is greater than the preset voltage threshold, and the fourth duration is greater than the third preset time threshold; wherein the second execution instruction is used to instruct the line protection apparatus to reset the set value of the distance protection impedance of the line connected to the compensator to a value before updating the set value of the distance protection impedance of the line connected to the compensator.

Optionally, the method further comprises the following steps after exiting the series converter and the series transformer:

sending a third execution instruction to the line protection apparatus when the mechanical bypass switch is turned off; wherein the third execution instruction is used to instruct the line protection apparatus to update the set value of the distance protection impedance of the line connected to the compensator according to a second preset rule;

starting timing after sending the third execution instruction, after a preset duration, acquiring the current and voltage of the line connected to the compensator;

enabling the series converter and the series transformer if the current of the line connected to the compensator is within a preset current range, and the voltage of the line connected to the compensator is within a preset voltage range;

sending a notification signal to the line protection apparatus when the mechanical bypass switch is closed; wherein the notification signal is used to inform the line protection apparatus to reset the set value of the distance protection impedance of the line connected to the compensator to a value before updating the set value of the distance protection impedance of the line connected to the compensator.

Optionally, the first preset time threshold is less than a first time; wherein the first time is the sum of the time required for the line protection apparatus to analyze and calculate a distance protection I segment of the line connected to the compensator and a protection action delay time of the distance protection I segment.

Alternatively, the first preset time threshold is smaller than the difference between the first time and the response time for triggering the fast bypass switch.

A method for suppressing the impact of a compensator on line distance protection, the method comprising:

receiving a first execution instruction sent by a compensator; and acquiring a set value of distance protection impedance of a line connected to the compensator in response to the first execution instruction and setting it to a first impedance;

updating the set value of the distance protection impedance of the line connected to the compensator based on the first impedance and a first preset rule;

receiving a second execution instruction sent by the compensator;

setting the set value of the distance protection impedance of the line connected to the compensator as the first impedance, in response to the second execution instruction.

Optionally, said updating the set value of the distance protection impedance of the line connected to the compensator based on the first impedance and a first preset rule comprising:

performing an equivalent processing on the impedance of the series converter based on the impedance of the line side connected to the compensator to obtain a second impedance;

adding the first impedance, the second impedance, and a leakage impedance of the series transformer to obtain a third impedance;

updating the set value of the distance protection impedance of the line connected to the compensator to the third impedance.

Optionally, the method further comprises:

receiving a third execution instruction sent by the compensator;

adding the first impedance to a leakage reactance of the series transformer to obtain a fourth impedance in response to the third execution instruction;

setting the set value of the distance protection impedance of the line connected to the compensator to the fourth impedance;

receiving a notification signal sent by the compensator;

setting the set value of the distance protection impedance of the line connected to the compensator as the first impedance in response to the notification signal.

A method for suppressing the impact of a compensator on line distance protection, the method comprising:

detecting a current of a line connected to a compensator or a series converter in the compensator to obtain a first current, and a voltage of a line connected to a compensator or a series converter in the compensator to obtain a first voltage, when the line connected to the compensator is working normally;

comparing a relationship between the first current and a preset current threshold;

locking the series converter and triggering the fast bypass switch connected in parallel with the series transformer to be turned on, and closing a mechanical bypass switch connected in parallel with the series transformer, if the first current is greater than the preset current threshold, and a first duration is greater than the first preset time threshold; wherein the first duration is a duration in which the first current is greater than the preset current threshold;

comparing a relationship between the first voltage and the preset voltage threshold if the first current is less than or equal to the preset a current threshold, or if the first current is greater than the preset current threshold and the first duration is less than or equal to the first preset time threshold;

setting the output voltage of the series converter to be zero, if the first voltage is less than or equal to the preset voltage threshold, and a second duration is greater than the second preset time threshold; wherein the second duration is a duration in which the first voltage is less than or equal to the preset voltage threshold;

acquiring a current of a component corresponding to the first current to obtain a second current;

locking the series converter, triggering the fast bypass switch connected in parallel with the series transformer to be turned on, and closing a mechanical bypass switch connected in parallel with the series transformer, if the second current is greater than the preset current threshold, and a third duration is greater than the first preset time threshold; wherein the third duration is a duration in which the second current is greater than the preset current threshold;

maintaining the output voltage of the series converter at zero, if the second current is less than or equal to the preset a current threshold, or if the second current is greater than the preset current threshold and the third duration is less than or equal to the first preset time threshold;

acquiring a voltage of the line corresponding to the first voltage to obtain a second voltage;

canceling setting an output voltage of the series converter to be zero, and performing the acquiring of the current of the line connected to the compensator or the series converter in the compensator to obtain a first current, if the second voltage is greater than the preset voltage threshold, and a fourth duration is greater than the third preset time threshold; wherein the fourth duration is a duration in which the second voltage is greater than the preset voltage threshold.

A compensator comprises: a first acquisition unit, a first comparison unit, an exiting unit, a first processing unit, and a second processing unit; wherein:

the first acquiring unit is configured to acquire a current of a line connected to the compensator or a series converter in the compensator to obtain a first current; wherein the compensator is used to control the current of the line connected to the compensator, the compensator comprising a static synchronous series compensator, a unified power flow controller, an interline power flow controller, and a convertible static compensator;

the first acquiring unit is further configured to acquire a voltage of a bus connected to the compensator or a line connected to the compensator to obtain the first voltage;

the first comparison unit is configured to compare a relationship between the first current and a preset current threshold;

the first comparison unit is further configured to compare a relationship between the first voltage and a preset voltage threshold;

the exiting unit is configured to exit the series converter and the series transformer if the first current is greater than the preset current threshold and a first duration is greater than the first preset time threshold, wherein the series transformer is a device in the compensator, the first duration is a duration in which the first current is greater than a first preset current threshold;

the first acquiring unit is further configured to acquire a voltage of a bus connected to the compensator or a line connected to the compensator to obtain the first voltage, if the first current is less than or equal to the preset current threshold, or if the first current is greater than the preset current threshold and the first duration is less than or equal to the first preset time threshold;

the first comparison unit is further configured to compare a relationship between the first voltage and a preset voltage threshold;

the first processing unit is configured to set an output voltage of the series converter to zero, and acquire a current of a component corresponding to the first current to obtain a second current, if the first voltage is less than or equal to the preset voltage threshold, and a second duration is greater than a second preset time threshold; wherein the second duration is a duration that the first voltage is less than or equal to the preset voltage threshold;

the exiting unit is further configured to exit the series converter and the series transformer if the second current is greater than the preset current threshold, and a third duration is greater than the first preset time threshold; wherein the third duration is a duration in which the second current is greater than the duration of the preset current threshold;

the first acquiring unit is further configured to acquire a voltage of a line corresponding to the first voltage to obtain a second voltage, if the second current is less than or equal to the preset current threshold, or if the second current is greater than the preset current threshold and the third duration is less than or equal to the first preset time threshold;

the second processing unit is configured to cancel setting the output voltage of the series converter to zero and perform the acquiring of the current of the line connected to the compensator or the series converter in the compensator to obtain the first current, if the second voltage is greater than the preset voltage threshold, and a fourth duration is greater than the third preset time threshold; wherein the fourth duration is a duration in which the second voltage is greater than the preset voltage threshold.

Optionally, the exiting unit includes a first processing module and a second processing module; wherein:

the first processing module is configured to lock the series converter and trigger the fast bypass switch connected in parallel with the series transformer to be turned on;

the second processing module is configured to close a mechanical bypass switch if the series transformer is connected in parallel with the mechanical bypass switch.

Optionally, the exiting unit further includes: a second acquiring unit and a third processing unit; wherein:

the second acquiring unit is configured to acquire the current and voltage of the line connected to the compensator when the preset time comes;

the third processing unit is configured to enable the series converter and the series transformer if the current of the line connected to the compensator is within a preset current range, and the voltage of the line connected to the compensator is within a preset voltage range.

Optionally, the second processing unit further includes: a first transmission unit and a third acquiring unit; wherein:

the first transmission unit is configured to send a first execution instruction to a line protection apparatus if the second current is less than or equal to the preset current threshold, or if the second current is greater than the preset current threshold and the third duration is less than or equal to the first preset time threshold; wherein the line protection apparatus is configured to protect the line connected to the compensator, and the first execution instruction is used to instruct the line protection apparatus to update a set value of the distance protection impedance of the line connected to the compensator according to a first preset rule;

the third acquiring unit is configured to acquire the second voltage after a preset time period from sending the first execution instruction;

the first transmission unit is further configured to send a second execution instruction to the line protection apparatus if the second voltage is greater than the preset voltage threshold, and the fourth duration is greater than the third preset time threshold; wherein the second execution instruction is used to instruct the line protection apparatus to reset the set value of the distance protection impedance of the line connected to the compensator to a value before updating the set value of the distance protection impedance of the line connected to the compensator.

Optionally, the exiting unit further includes: a second transmission unit, a fourth acquiring unit, and a fourth processing unit; wherein:

the second transmission unit is configured to send a third execution instruction to the line protection apparatus when the mechanical bypass switch is turned off; wherein the third execution instruction is used to instruct the line protection apparatus to update the set value of the distance protection impedance of the line connected to the compensator according to a second preset rule;

the fourth acquiring unit is configured to start timing after sending the third execution instruction, after a preset duration, acquire the current and voltage of the line connected to the compensator;

the fourth processing unit is configured to enable the series converter and the series transformer if the current of the line connected to the compensator is within a preset current range, and the voltage of the line connected to the compensator is within a preset voltage range;

the second transmission unit is further configured to send a notification signal to the line protection apparatus when the mechanical bypass switch is closed; wherein the notification signal is used to inform the line protection apparatus to reset the set value of the distance protection impedance of the line connected to the compensator to a value before updating the set value of the distance protection impedance of the line connected to the compensator.

Optionally, the first preset time threshold is less than the first time; wherein the first time is the sum of the time required for the line protection apparatus to analyze and calculate a distance protection I segment of the line connected to the compensator and a protection action delay time of the distance protection I segment;

Alternatively, the first preset time threshold is smaller than the difference between the first time and the response time for triggering the fast bypass switch.

A line protection apparatus, comprising: a receiving unit, a fifth processing unit and an updating unit; wherein:

the receiving unit is configured to receive a first execution instruction sent by a compensator;

the fifth processing unit is configured to acquire a set value of distance protection impedance of a line connected to the compensator in response to the first execution instruction and set it to a first impedance;

the updating unit is configured to update the set value of the distance protection impedance of the line connected to the compensator based on the first impedance and a first preset rule;

the receiving unit is further configured to receive a second execution instruction sent by the compensator;

the fifth processing unit is further configured to set the set value of the distance protection impedance of the line connected to the compensator as the first impedance, in response to the second execution instruction.

Optionally, the update unit includes: a third processing module, a calculating module and an updating module; wherein:

the third processing module is configured to perform an equivalent processing on the impedance of the series converter based on the impedance of the line side connected to the compensator to obtain a second impedance;

the calculating module is further configured to add the first impedance, the second impedance, and a leakage reactance of the series transformer to obtain a third impedance;

the updating module is further configured to update the set value of the distance protection impedance of the line connected to the compensator to the third impedance.

Optionally, the apparatus further includes a first setting unit; wherein:

the receiving unit is further configured to receive a third execution instruction sent by the compensator;

the fifth processing unit is further configured to add the first impedance to a leakage reactance of the series transformer to obtain a fourth impedance in response to the third execution instruction;

the first setting unit is configured to set the set value of the distance protection impedance of the line connected to the compensator to the fourth impedance;

the receiving unit is further configured to receive a notification signal sent by the compensator;

the fifth processing unit is further configured to set the set value of the distance protection impedance of the line connected to the compensator as the first impedance in response to the notification signal.

A compensator includes: a detecting unit, a second comparison unit, a sixth processing unit, a second setting unit, a fifth acquiring unit, and a maintaining unit; wherein:

the detecting unit is configured to detect a current of a line connected to a compensator or a series converter in the compensator to obtain a first current, and a voltage of a line connected to a compensator or a series converter in the compensator to obtain a first voltage, when the line connected to the compensator is working normally;

the second comparison unit is configured to compare a relationship between the first current and a preset current threshold;

the sixth processing unit is configured to lock the series converter and trigger the fast bypass switch connected in parallel with the series transformer to be turned on, and close a mechanical bypass switch connected in parallel with the series transformer, if the first current is greater than the preset current threshold, and a first duration is greater than the first preset time threshold; wherein the first duration is a duration in which the first current is greater than the preset current threshold;

the second comparison unit is further configured to compare a relationship between the first voltage and the preset voltage threshold if the first current is less than or equal to the preset a current threshold, or if the first current is greater than the preset current threshold and the first duration is less than or equal to the first preset time threshold;

the second setting unit is configured to set the output voltage of the series converter to be zero, if the first voltage is less than or equal to the preset voltage threshold, and a second duration is greater than the second preset time threshold; wherein the second duration is a duration in which the first voltage is less than or equal to the preset voltage threshold;

the fifth acquiring unit is configured to acquire a current of a component corresponding to the first current to obtain a second current;

the sixth processing unit is further configured to lock the series converter, trigger the fast bypass switch connected in parallel with the series transformer to be turned on, and close a mechanical bypass switch connected in parallel with the series transformer, if the second current is greater than the preset current threshold, and a third duration is greater than the first preset time threshold; wherein the third duration is a duration in which the second current is greater than the preset current threshold;

the maintaining unit is configured to maintain the output voltage of the series converter at zero, if the second current is less than or equal to the preset a current threshold, or if the second current is greater than the preset current threshold and the third duration is less than or equal to the first preset time threshold;

the fifth acquiring unit is configured to acquire a voltage of the line corresponding to the first voltage to obtain a second voltage;

the sixth processing unit is further configured to cancel setting an output voltage of the series converter to be zero, and perform the acquiring of the current of the line connected to the compensator or the series converter in the compensator to obtain a first current, if the second voltage is greater than the preset voltage threshold, and a fourth duration is greater than the third preset time threshold; wherein the fourth duration is a duration in which the second voltage is greater than the preset voltage threshold.

A method and apparatus for suppressing the impact of a compensator on line distance protection is provided by embodiments of the present invention, wherein the method comprises: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

DESCRIPTION OF EMBODIMENTS

The technical solutions in the embodiments of the present invention will be clearly and completely described in the following with reference to the accompanying drawings.

Figure 1:
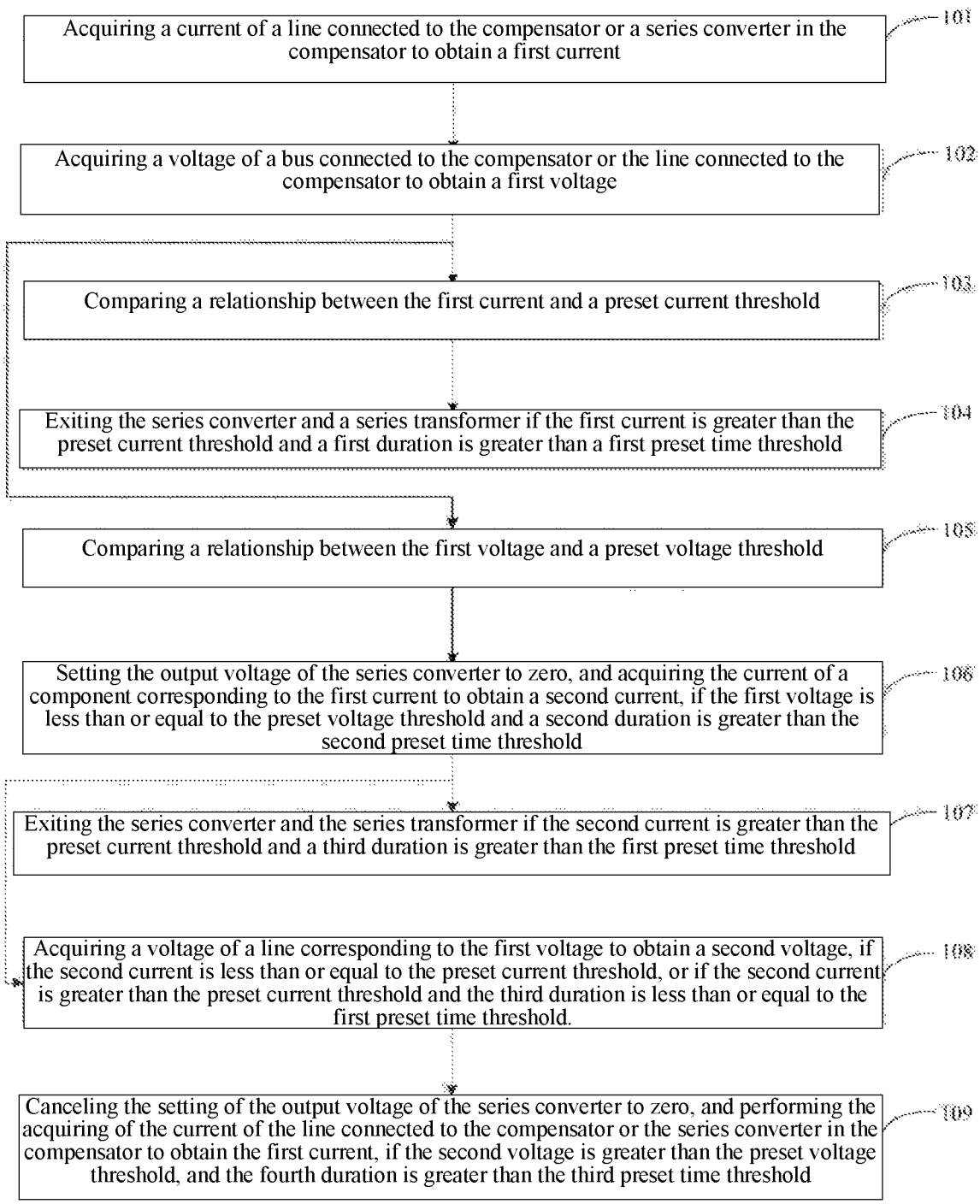
FIG. 1 is a schematic flowchart of a method for suppressing an impact of a compensator on line distance protection according to an embodiment of the present invention.

Embodiments of the present invention provide a method for suppressing the impact of a compensator on line distance protection. Referring to FIG. 1, the method includes the following steps:

Step 101: acquiring a current of a line connected to the compensator or a series converter in the compensator to obtain a first current.

Wherein, the compensator is used for controlling the current of the line connected to the compensator, and the compensator comprises a static synchronous series compensator, a unified power flow controller, an interline power flow controller and a convertible static compensator.

Specifically, acquiring a current of a line connected to the compensator or a series converter in the compensator to obtain a first current in step 101 can be achieved by the apparatus that suppresses the impact of the compensator on the line distance protection. The apparatus for suppressing the impact of the compensator on the line distance protection may be a compensator, and the compensator may be a static synchronous series compensator, a unified power flow controller, an interline power flow controller, and a convertible static compensator.

In this embodiment, when the line connected to the compensator fails, the line protection apparatus (such as the relay protection device) needs to perform the relay protection operation on the line connected to the compensator; and before acquiring a current of a line connected to the compensator or a series converter in the compensator, and when the line connected to the compensator works normally, the current of current of a line connected to the compensator or a series converter in the compensator and the voltage of the bus connected to the compensator or the line connected to the compensator can be monitored by the compensator in real time, so that it can be found in time whether the line connected to the compensator is faulty.

Step 102: acquiring a voltage of a bus connected to the compensator or the line connected to the compensator to obtain a first voltage.

Specifically, acquiring a voltage of a bus connected to the compensator or the line connected to the compensator to obtain a first voltage in step 102 can be realized by an apparatus that suppresses the impact of the compensator on the line distance protection.

It should be noted that step 101 and step 102 are performed in no particular order, and step 101 and step 102 can be performed simultaneously.

Step 103: comparing a relationship between the first current and a preset current threshold.

Specifically, comparing a relationship between the first current and a preset current threshold in step 103 can be achieved by an apparatus that suppresses the impact of the compensator on the line distance protection. The preset current threshold may be an empirical value obtained by actually measuring and analyzing an overcurrent that the power system can withstand, or an empirical value obtained by theoretical analysis, or an empirical value obtained by combining actual measurement analysis and theoretical analysis. It should be noted that the preset current threshold can be modified according to the specific situation.

Step 104: exiting the series converter and a series transformer, if the first current is greater than the preset current threshold, and a first duration is greater than a first preset time threshold.

Wherein, the series transformer is a device in the compensator, and the first duration is a duration in which the first current is greater than the preset current threshold.

Specifically, in step 104, if the first current is greater than the preset current threshold and the first duration is greater than the first preset time threshold, the exiting the series converter and the series transformer may be achieved by an apparatus that suppresses the impact of the compensator on the line distance protection. The first preset time threshold may be an empirical value obtained by actual measurement analysis, or an empirical value obtained by theoretical analysis, or an empirical value obtained by combining actual measurement analysis and theoretical analysis.

Step 105: comparing a relationship between the first voltage and a preset voltage threshold.

Specifically, comparing the relationship between the first voltage and the preset voltage threshold in step 105 can be achieved by an apparatus that suppresses the impact of the compensator on the line distance protection. The preset voltage threshold may be an empirical value obtained by theoretical analysis, or may be obtained by a large number of actual measurement and theoretical analysis, and the preset voltage threshold may be corrected for specific situation which may be determined according to the actual situation.

It should be noted that steps 103-104 and step 105 are performed in no particular order, and steps 103-104 and step 105 can be performed simultaneously.

Step 106: setting an output voltage of the series converter to be zero, and acquiring a current of the component corresponding to the first current to obtain a second current, if the first voltage is less than or equal to the preset voltage threshold and the second duration is greater than the second preset time threshold.

Wherein the second duration is a duration in which the first voltage is less than or equal to the preset voltage threshold.

Specifically, setting an output voltage of the series converter to be zero, and acquiring a current of the component corresponding to the first current to obtain a second current, if the first voltage is less than or equal to the preset voltage threshold and the second duration is greater than the second preset time threshold in step 106 can be achieved by an apparatus that suppress the effect of the compensator on line distance protection. When the first current is less than or equal to the preset current threshold, or if the first current is greater than the preset current threshold and the first duration is less than or equal to the first preset time threshold, if the first voltage is less than or equal to the preset voltage threshold and The second duration is greater than the second preset time threshold, and after the output voltage of the series converter is set to zero, the current of the component corresponding to the first current is obtained to obtain a second current, so that the line converter can be determined to be line protection. The impact of the device. If the first voltage of the bus connected to the compensator or the line connected to the compensator is greater than the preset voltage threshold, repeating steps 101-109, so that when the line connected to the compensator fails again, it is possible to exit the series converter and the series transformer in the compensator, and set the output voltage of the series converter to zero, which suppresses the impact of the compensator on the line protection apparatus. The second preset time threshold may be an empirical value obtained by actual measurement analysis, or an empirical value obtained by theoretical analysis, or an empirical value obtained by combining actual measurement analysis and theoretical analysis.

Wherein, after the step 106 of setting an output voltage of the series converter to be zero, and acquiring a current of the component corresponding to the first current to obtain a second current, if the first voltage is less than or equal to the preset voltage threshold and the second duration is greater than the second preset time threshold, steps 107-108 or step 109 are selected to perform; steps 107-108 are selected to perform if the second current is greater than the preset current threshold, and the third duration is greater than the first preset time threshold; and step 109 is selected to perform if the second voltage is greater than the preset voltage threshold, and the fourth duration is greater than the third preset time threshold;

Step 107: exiting the series converter and the series transformer if the second current is greater than the preset current threshold, and a third duration is greater than the first preset time threshold.

The third duration is a duration in which the second current is greater than the preset current threshold.

Specifically, exiting the series converter and the series transformer if the second current is greater than the preset current threshold, and a third duration is greater than the first preset time threshold in step 107 may be achieved by an apparatus that suppresses the impact of the compensator on the line distance protection. The third preset time threshold may be an empirical value obtained by actual measurement analysis, or an empirical value obtained by theoretical analysis, or an empirical value obtained by combining actual measurement analysis and theoretical analysis.

Step 108: acquiring a voltage of a line corresponding to the first voltage to obtain a second voltage, if the second current is less than or equal to the preset current threshold, or if the second current is greater than the preset current threshold and the third duration is less than or equal to the first preset time threshold.

Specifically, acquiring a voltage of a line corresponding to the first voltage to obtain a second voltage, if the second current is less than or equal to the preset current threshold, or if the second current is greater than the preset current threshold and the third duration is less than or equal to the first preset time threshold in step 108 may be achieved by an apparatus that suppresses the impact of the compensator on the line distance protection.

Step 109: canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold.

Wherein, the fourth duration is a duration in which the second voltage is greater than the preset voltage threshold.

Specifically, canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold in step 109 can be achieved by an apparatus that suppresses the impact of the compensator on the line distance protection. When the second voltage is greater than the preset voltage threshold, and the fourth duration is greater than the third preset time threshold, canceling the setting of the output voltage of the series converter to zero, that is, the output voltage of the series converter is no longer controlled to be zero. The output voltage of the series converter is the current voltage to be output, and the corresponding operations in steps 101-109 are repeatedly performed, so that when the line connected to the compensator fails again, it is possible to exit the series converter and the series transformer in the compensator, and set the output voltage of the series converter to zero, to suppress the impact of the compensator on the line protection apparatus.

It should be noted that the first preset time threshold, the second preset time threshold, and the third preset time threshold may be the same or different, and the specific situation may be determined by actual application.

A method for suppressing the impact of the compensator on the line distance protection is provided by the embodiment of the present invention, wherein the method comprises: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Figure 2:
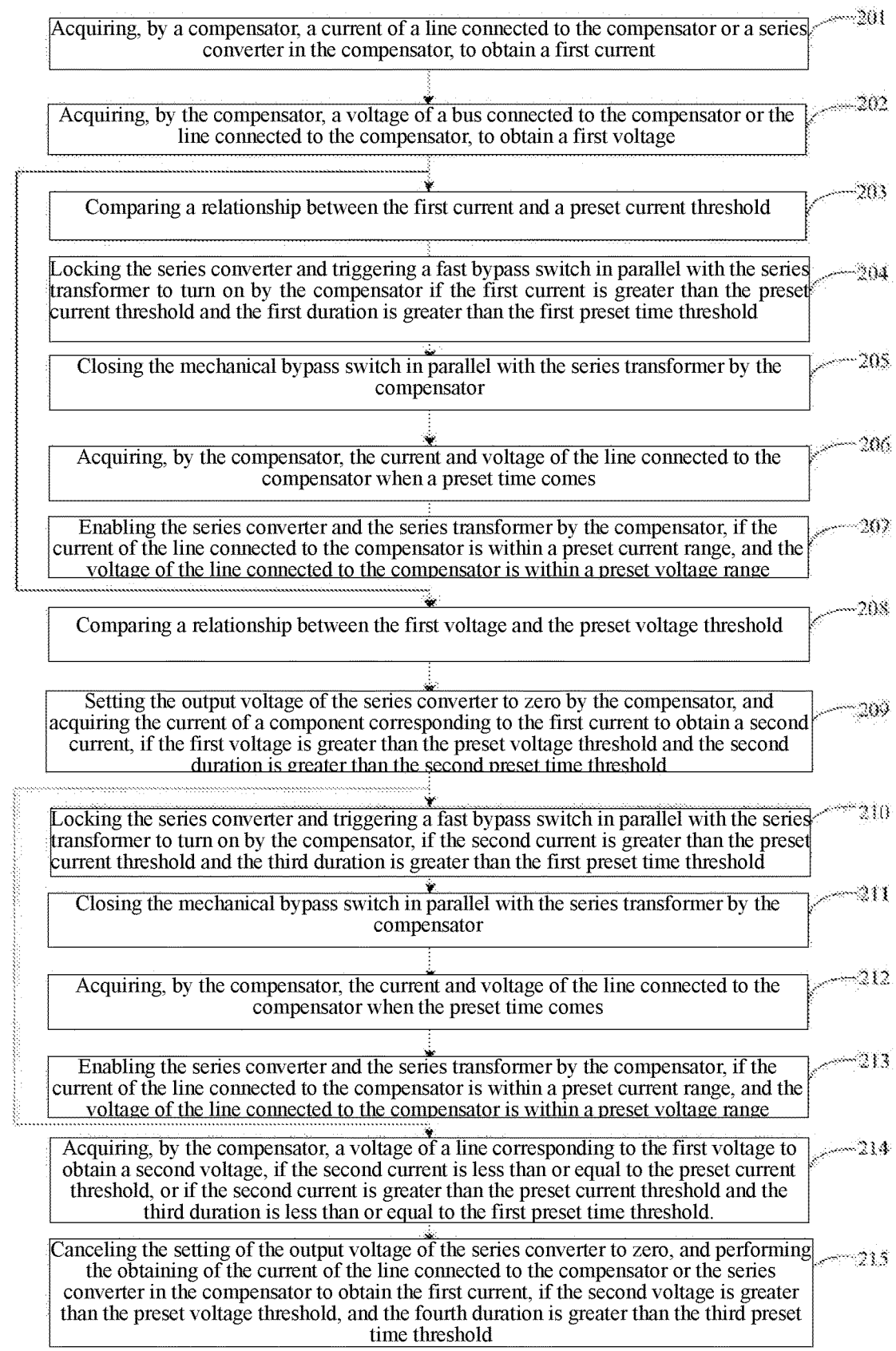
FIG. 2 is a schematic flow chart of another method for suppressing the impact of a compensator on line distance protection according to an embodiment of the present invention.

An embodiment of the present invention provides a method for suppressing the impact of a compensator on line distance protection. Referring to FIG. 2, the method includes the following steps:

Step 201: acquiring a current of a line connected to the compensator or a series converter in the compensator to obtain a first current by the compensator.

Wherein the compensator is configured to control the current of a line connected to the compensator, the compensator comprising a static synchronous series compensator, a unified power flow controller, an interline power flow controller, and a convertible static compensator.

Specifically, the current obtained by the compensator may be an alternating current, and the obtained voltage may be an alternating current voltage. Taking the compensator as the UPFC and the current obtained is the AC current of the series converter in the UPFC as an example. When the UPFC-controlled power transmission system works normally or fails, the AC current of the line connected to the compensator or the AC current of the series converter in the UPFC can be acquired to obtain the first current.

Step 202: acquiring a voltage of a bus connected to the compensator or the line connected to the compensator to obtain a first voltage by the compensator.

Specifically, taking that the voltage obtained by the compensator is an AC voltage of the bus connected to the UPFC as an example, if the AC current of the series converter in the UPFC does not satisfy the condition in step 203, no operation is performed on the series converter and the series transformer, but continuing to obtain the AC voltage of the bus connected to the UPFC for analysis.

It should be noted that step 201 and step 202 are performed in no particular order, and step 201 and step 202 can be performed simultaneously.

Step 203: comparing a relationship between the first current and a preset current threshold by the compensator.

Specifically, the preset current threshold corresponding to the alternating current of the series converter and the preset current threshold corresponding to the alternating current of the line connected to the compensator may be the same or different, and the specific situation is determined according to actual conditions. When the power system controlled by the UPFC fails, the compensator compares the magnitude relationship between the current of the series converter in the UPFC and the preset current threshold.

Step 204: locking the series converter and triggering the fast bypass switch connected in parallel with the series transformer to be turned on by the compensator, if the first current is greater than the preset current threshold, and a first duration is greater than the first preset time threshold.

Wherein the series transformer is a device in the compensator, and the first duration is a duration in which the first current is greater than the preset current threshold; the first preset time threshold is less than the first time, and the first time is the first time is the sum of the time required for the line protection apparatus to analyze and calculate a distance protection I segment of the line connected to the compensator and a protection action delay time of the distance protection I segment; or, the first preset time threshold is smaller than the difference between the first time and the response time for triggering the fast bypass switch.

Specifically, when the AC current of the series converter in the UPFC is greater than a preset current threshold, and the first duration is greater than the first preset time threshold, the compensator locks the series converter and triggers a fast bypass switch connected to the series transformer to be turned on to enable overcurrent protection.

Step 205: closing a mechanical bypass switch connected in parallel with the series transformer by the compensator.

Specifically, if the AC current of the series converter in the UPFC is greater than a preset current threshold, and the duration of the AC current of the series converter in the UPFC is greater than the preset current threshold, the compensator locks the series converter, and turns on the fast bypass switch connected in parallel with the series transformer, and the compensator closes the mechanical bypass switch, which can also realize the function of overcurrent protection.

Step 206: acquiring the current and voltage of the line connected to the compensator by the compensator when the preset time comes.

Specifically, the preset time may be a time period, or may be a future time point, and may be set by the time required by the line protection apparatus to perform the protection action corresponding to the line protection function or the empirical value obtained the theoretical analysis according to the actual situation, for example, 5 minutes, etc.; after exiting the series converter and the series transformer in the UPFC, when the preset time comes, the AC current and the AC voltage of the line connected to the compensator in the UPFC are acquired, The preset time may be set by the user according to a specific troubleshooting situation, and is not limited.

Step 207: enabling the series converter and the series transformer by the compensator if the current of the line connected to the compensator is within a preset current range, and the voltage of the line connected to the compensator is within a preset voltage range.

Specifically, it may be performed by determining whether the AC current of the line connected to the compensator is within a preset current range and whether the AC voltage of the line connected to the compensator is within a preset voltage range, or, by first determining whether the AC current of the line connected to the compensator is within the preset current range, if the AC current of the line connected to the compensator is within the preset current range, then determine whether the AC voltage of the line connected to the compensator is within the preset voltage range; or, first determining whether the AC voltage of the line connected to the compensator is within a preset voltage range, if the AC voltage of the line connected to the compensator is within a preset voltage range, then determine whether the AC current of the line connected to the compensator is within a preset current range, obtaining the result of the determining, if the AC current of the line connected to the compensator is within the preset current range, and the AC voltage of the line connected to the compensator is within the preset voltage range, then enabling the series converter and the series transformer that have been exited when the AC current of the line connected to the compensator is in the preset current range, and the AC voltage of the line connected to the compensator is within the preset voltage range, so that the series converter and a series transformer are put into operation again, realizing the control of the active and reactive power flow in power system.

Step 208: comparing a relationship between the first voltage and the preset voltage threshold by the compensator.

Specifically, the preset voltage threshold corresponding to the AC voltage of the bus connected to the UPFC may be the same as the preset voltage threshold corresponding to the AC voltage of the line connected to the UPFC, and may be different according to the actual application.

Step 209: setting an output voltage of the series converter to zero and acquiring a current of a component corresponding to the first current to obtain a second current by the compensator, if the first voltage is less than or equal to the preset voltage threshold, and a second duration is greater than a second preset time threshold.

Wherein the second duration is a duration in which the first voltage is less than or equal to the preset voltage threshold.

Specifically, if the first voltage is greater than the preset voltage threshold, or the first voltage is less than or equal to the preset voltage threshold and the second duration is less than the second preset time threshold, the compensator repeatedly performs steps 201-213, so that when the line connected to the compensator fails again, it is possible to exit the series converter and the series transformer in the compensator, and when the preset time comes, re-enable the series converter and the series transformer in the compensator to control overcurrent of the line connected to the compensator.

When the AC voltage of the line connected to the UPFC is less than or equal to the preset voltage threshold and the second duration is greater than the second preset time threshold, the UPFC sets the output voltage of the series converter to be zero, thus reducing the effect of the series converter of the UPFC on the line protection apparatus. It should be noted that step 209 implicitly includes a determining process of comparing the relationship between the second current and the preset current threshold.

Wherein, after the step 209 of setting an output voltage of the series converter to zero and acquiring a current of a component corresponding to the first current to obtain a second current by the compensator, if the first voltage is less than or equal to the preset voltage threshold, and a second duration is greater than a second preset time threshold, and steps 210-213 or steps 214-215 may be selected to perform. If the second current is greater than the preset current threshold, and the third duration is greater than the first preset time threshold, steps 210-213 are selected to perform. If the second current is less than or equal to the preset current threshold, or if the second current is greater than the preset current threshold and the third duration is less than or equal to the first preset time threshold, perform steps 214-215.

Step 210: locking the series converter, triggering the fast bypass switch connected in parallel with the series transformer to be turned on, by the compensator, if the second current is greater than the preset current threshold, and a third duration is greater than the first preset time threshold.

The third duration is a duration in which the second current is greater than the preset current threshold.

Step 211: The compensator closes the mechanical bypass switch in parallel with the series transformer.

Step 212: When the preset time comes, the compensator acquires the current and voltage of the line connected to the compensator.

Step 213: If the current of the line connected to the compensator is within a preset current range, and the voltage of the line connected to the compensator is within a preset voltage range, the compensator enables the series converter and the series transformer.

Step 214: If the second current is less than or equal to the preset current threshold, or if the second current is greater than the preset current threshold and the third duration is less than or equal to the first preset time threshold, the compensator acquires the voltage of the line corresponding to the first voltage to obtain the second voltage.

Step 215: If the second voltage is greater than the preset voltage threshold, and the fourth duration is greater than the third preset time threshold, the compensator cancels setting the output voltage of the series converter to zero, and performs acquiring the current of the line connected to the compensator or the series converter in the compensator to obtain the first current.

Wherein, the fourth duration is a duration in which the second voltage is greater than the preset voltage threshold.

Specifically, if the second voltage is less than or equal to the preset voltage threshold, or if the second voltage is greater than the preset voltage threshold and the fourth duration is less than or equal to the third preset time threshold, the output voltage of the series converter in the UPFC is maintained at zero.

It should be noted that steps 203-207 and steps 208-215 are performed in no particular order, and steps 203-207 and steps 208-215 can be performed simultaneously.

It should be noted that the description of the same steps or concepts in the other embodiments may be referred to in other embodiments, and details are not described herein again.

A method for suppressing the impact of the compensator on the line distance protection is provided by the embodiment of the present invention, wherein the method comprises: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Figure 3:
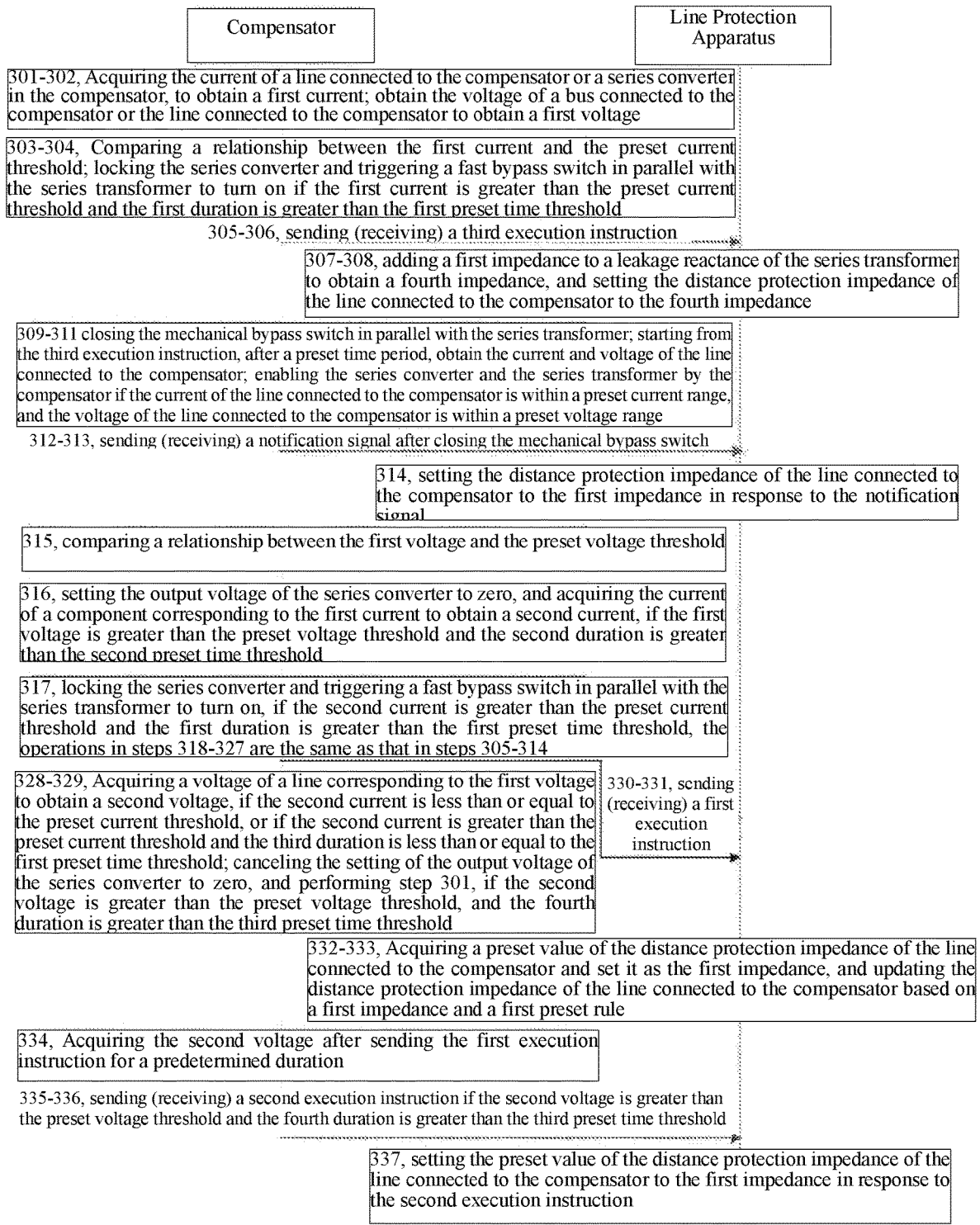
FIG. 3 is a schematic flowchart diagram of still another method for suppressing the impact of a compensator on line distance protection according to an embodiment of the present invention.

An embodiment of the present invention provides a method for suppressing the impact of a compensator on line distance protection. Referring to FIG. 3, the method includes the following steps:

Step 301: acquiring a current of a line connected to the compensator or a series converter in the compensator to obtain a first current by the compensator.

Wherein the compensator is used for controlling the current of the line connected to the compensator, and the compensator comprises a static synchronous series compensator, a unified power flow controller, an interline power flow controller and a convertible static compensator.

Step 302: acquiring a voltage of a bus connected to the compensator or the line connected to the compensator to obtain a first voltage by the compensator.

It should be noted that step 301 and step 302 are performed in no particular order, and step 301 and step 302 can be performed simultaneously.

Step 303: comparing a relationship between the first current and a preset current threshold by the compensator.

Step 304: locking the series converter and triggering the fast bypass switch connected in parallel with the series transformer to be turned on by the compensator, if the first current is greater than the preset current threshold, and a first duration is greater than the first preset time threshold.

The series transformer is a device in the compensator, and the first duration is a duration in which the first current is greater than the preset current threshold; the first preset time threshold is less than the first time, and the first time is the first time is the sum of the time required for the line protection apparatus to analyze and calculate a distance protection I segment of the line connected to the compensator and a protection action delay time of the distance protection I segment; or, the first preset time threshold is smaller than the difference between the first time and the response time for triggering the fast bypass switch.

Step 305: The compensator sends a third execution instruction to the line protection apparatus.

Wherein the third execution instruction is used to instruct the line protection apparatus to update the distance protection impedance set value of the line connected to the compensator according to the second preset rule.

Specifically, the device for suppressing the impact of the compensator on the line distance protection may also be a line protection apparatus, and the line protection apparatus may be a protection device such as a relay protection device. A communication process can be established between the compensator and the line protection apparatus. After exiting the series transformer and the series converter, the execution instruction is sent to the line protection apparatus, and the line protection apparatus is notified to the distance protection impedance set value of the line connected to the compensator and perform the corresponding protection operations. The third execution instruction may be sent to the line protection apparatus before closing the mechanical bypass switch after turning on the fast bypass switch connected in parallel with the series transformer.

Step 306: The line protection apparatus receives a third execution instruction sent by the compensator.

Step 307: The line protection apparatus adds the first impedance to the leakage reactance of the series transformer to obtain a fourth impedance in response to the third execution instruction.

Specifically, the leakage reactance of the series transformer can be obtained from the instruction manual of the series transformer or the nameplate of the series transformer. The first impedance is the distance protection impedance set value of the line connected to the compensator.

Step 308: The line protection apparatus sets the distance protection impedance set value of the line connected to the compensator to the fourth impedance.

Step 309, the compensator closes the mechanical bypass switch in parallel with the series transformer.

Wherein, since the mechanical bypass switch connected in parallel with the series transformer has a time delay, the step 311 of closing the mechanical bypass switch in parallel with the series transformer by the compensator can be performed simultaneously with step 304, and step 305 is performed when a mechanical bypass switch in parallel with the series transformer has not been successfully closed.

Step 310: The compensator starts timing after sending the third execution instruction, and obtains current and voltage of the line connected to the compensator after the preset time period.

Step 311: If the current of the line connected to the compensator is within a preset current range, and the voltage of the line connected to the compensator is within a preset voltage range, the compensator enables the series converter and the series transformer.

Specifically, enabling the series converter can be achieved by enabling the series converter. The enabling series transformer can be realized by disconnecting the mechanical bypass switch in parallel with the series transformer. In practical engineering applications, after the mechanical bypass switch is closed, the turned-on fast bypass switch will automatically lock.

Step 312: After the mechanical bypass switch connected in parallel with the series transformer is closed, the compensator sends a notification signal to the line protection apparatus.

The notification signal is used to notify the line protection apparatus to set the distance protection impedance of the line connected to the compensator to a value before updating the distance protection impedance set value of the line connected to the compensator.

Specifically, the notification signal may be a signal sent to the line protection apparatus immediately after the mechanical bypass switch connected in parallel with the series transformer is closed.

It should be noted that steps 309-310 and step 312 are performed in no particular order, and steps 309-310 may be performed after step 312, or may be performed simultaneously with step 312. The specific execution process may be determined by actual conditions.

Step 313: The line protection apparatus receives the notification signal sent by the compensator.

Step 314: The line protection apparatus responds to the notification signal, and sets a distance protection impedance set value of the line connected to the compensator as the first impedance.

Specifically, when the line protection apparatus sets the distance protection impedance set value of the line connected to the compensator to the first impedance, a response instruction may be sent to the compensator.

Step 315: The compensator compares the relationship between the first voltage and the preset voltage threshold.

Step 316: If the first voltage is less than or equal to the preset voltage threshold, and the second duration is greater than the second preset time threshold, the compensator sets the output voltage of the series converter to zero, and acquires the current of the component corresponding to the first current to obtain a second current.

The second duration is a duration in which the first voltage is less than or equal to the preset voltage threshold.

Wherein, after the step 316 in which if the first voltage is less than or equal to the preset voltage threshold, and the second duration is greater than the second preset time threshold, the compensator sets the output voltage of the series converter to zero, and acquires the current of the component corresponding to the first current to obtain a second current, steps 317-327 or steps 328-337 may be selected to perform. If the second current is greater than the preset current threshold, and the third duration is greater than the first preset time threshold, steps 317-327 are selected to perform. If the second current is less than or equal to the preset current threshold, or if the second current is greater than the preset current threshold and the third duration is less than or equal to the first preset time threshold, steps 328-337 are selected to perform.

Step 317: If the second current is greater than the preset current threshold, and the third duration is greater than the first preset time threshold, the compensator locks the series converter and triggers the fast bypass switch connected in parallel with the series transformer to be turned on.

The third duration is a duration in which the second current is greater than the preset current threshold.

Step 318: After the mechanical bypass switch connected in parallel with the series transformer is closed, the compensator sends a third execution instruction to the line protection apparatus.

The third execution instruction is used to instruct the line protection apparatus to update the distance protection impedance set value of the line connected to the compensator according to the second preset rule.

Step 319: The line protection apparatus receives a third execution instruction sent by the compensator.

Step 320: The line protection apparatus adds the first impedance to the leakage reactance of the series transformer to obtain a fourth impedance in response to the third execution instruction.

Step 321: The line protection apparatus sets a distance protection impedance set value of the line connected to the compensator to a fourth impedance.

Step 322: The compensator closes the mechanical bypass switch in parallel with the series transformer.

Step 323: The compensator starts timing after sending the third execution instruction, and obtains current and voltage of the line connected to the compensator after the preset time period.

Step 324: If the current of the line connected to the compensator is within a preset current range, and the voltage of the line connected to the compensator is within a preset voltage range, the compensator enables the series converter and the series transformer.

Step 325: After the mechanical bypass switch connected in parallel with the series transformer is closed, a notification signal is sent to the line protection apparatus.

Wherein the notification signal is used to notify the line protection apparatus to set the distance protection impedance of the line connected to the compensator to a value before updating the distance protection impedance set value of the line connected to the compensator.

Step 326: The line protection apparatus receives the notification signal sent by the compensator.

Step 327: The line protection apparatus responds to the notification signal, and sets a distance protection impedance set value of the line connected to the compensator as the first impedance.

Step 328: If the second current is less than or equal to the preset current threshold, or if the second current is greater than the preset current threshold and the third duration is less than or equal to the first preset time threshold, the compensator acquires the voltage of the line corresponding to the first voltage to obtain the second voltage.

Step 329: If the second voltage is greater than the preset voltage threshold, and the fourth duration is greater than the third preset time threshold, the compensator cancels setting the output voltage of the series converter to zero, and performs acquiring the current of the line connected to the compensator or the series converter in the compensator to obtain the first current.

Wherein, the fourth duration is a duration in which the second voltage is greater than the preset voltage threshold.

Specifically, the compensator cancels setting the output voltage of the series converter to zero, that is, cancels the control process of the output voltage of the series converter, so that the output voltage of the series converter is the voltage that should be currently output.

Step 330: If the second current is less than or equal to the preset current threshold, or if the second current is greater than the preset current threshold and the third duration is less than or equal to the first preset time threshold, the compensator sends the first execution instruction to the line protection apparatus.

The line protection apparatus is configured to protect the line connected to the compensator, and the first execution instruction is used to instruct the line protection apparatus to update the distance protection impedance set value of the line connected to the compensator according to the first preset rule.

The steps 328-329 and the step 330 are performed in no particular order. The steps 328-329 can be performed simultaneously with the step 330. The specific execution process can be determined according to the actual application.

Step 331: The line protection apparatus receives the first execution instruction sent by the compensator.

Step 332: The line protection apparatus responds to the first execution instruction, acquires a distance protection impedance set value of the line connected to the compensator, and sets it as the first impedance.

Step 333: The line protection apparatus updates the distance protection impedance set value of the line connected to the compensator based on the first impedance and the first preset rule.

The step 333 of updating the distance protection impedance set value of the line connected to the compensator based on the first impedance and the first preset rule by the line protection apparatus may be implemented by the following:

a. The line protection apparatus performs equivalent processing on the impedance of the series converter based on the impedance of the line side connected to the compensator to obtain a second impedance.

Specifically, since the impedance of the line side connected to the compensator is much larger than the impedance of the series converter, the equivalent resistance calculation method can be used to equivalently process the impedance of the series converter to obtain the equivalent impedance of the first impedance corresponding to the impedance of the line side.

b. The line protection apparatus adds the first impedance, the second impedance, and the leakage reactance of the series transformer to obtain a third impedance.

c. The line protection apparatus updates the distance protection impedance of the line connected to the compensator to the third impedance.

Step 333: The compensator starts timing after sending the first execution instruction, and acquires the second voltage after the preset time period.

Specifically, corresponding to step 330, Step 334 is performed by the compensator when the second current is less than or equal to the preset current threshold, or the second current is greater than the preset current threshold and the third duration is less than or equal to the first preset time threshold, so the obtained second voltage is the same voltage as the second voltage obtained in step 328.

Step 335: If the second voltage is greater than the preset voltage threshold, and the fourth duration is greater than the third preset time threshold, the compensator sends the second execution instruction to the line protection apparatus.

Wherein the second execution instruction is used to indicate the line protection apparatus to reset the distance protection impedance set value of the line connected to the compensator to a value before updating the distance protection impedance set value of the line connected to the compensator.

Step 336: The line protection apparatus receives a second execution instruction sent by the compensator.

Step 337: The line protection apparatus sets the distance protection impedance set value of the line connected to the compensator to the first impedance in response to the second execution instruction.

Specifically, the first resistance value is assigned to the distance protection impedance set value of the line connected to the compensator, so that the impact of the compensator on the line protection apparatus protecting the line connected to the compensator can be further suppressed.

Further, steps 303-314 and steps 315-337 are not performed in particular order, and steps 303-314 and steps 315-337 can be performed simultaneously.

It should be noted that the description of the same steps or concepts in the other embodiments may be referred to in other embodiments, and details are not described herein again.

A method for suppressing the impact of the compensator on the line distance protection is provided by the embodiment of the present invention, wherein the method comprises: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Based on the foregoing embodiments, an embodiment of the present invention provides a method for suppressing an impact of a compensator on line distance protection, and the method includes the following steps:

Step A: When the line connected to the compensator works normally, the compensator detects the current of the line connected to the compensator or the series converter in the compensator to obtain the first current, and detects the voltage of the bus or the line connected to the compensator to obtain the first voltage.

Step B: The compensator compares the relationship between the first current and the preset current threshold.

Step C: If the first current is greater than the preset current threshold, and the first duration is greater than the first preset time threshold, the compensator locks the series converter, triggers the fast bypass switch connected in parallel with the series transformer to be turned on, and closes a mechanical bypass switch in parallel with a series transformer.

The first duration is a duration in which the first current is greater than the preset current threshold.

Step D: If the first current is less than or equal to the preset current threshold, or if the first current is greater than the preset current threshold and the first duration is less than or equal to the first preset time threshold, the compensator compares the relationship between the first voltage with the preset voltage threshold.

Step E: If the first voltage is less than or equal to the preset voltage threshold, and the second duration is greater than the second preset time threshold, the compensator sets the output voltage of the series converter to be zero.

The second duration is a duration in which the first voltage is less than or equal to the preset voltage threshold.

Step F: The compensator acquires a current of the component corresponding to the first current to obtain a second current.

Step G: If the second current is greater than the preset current threshold, and the third duration is greater than the first preset time threshold, the compensator locks the series converter, triggers the fast bypass switch connected in parallel with the series transformer to be turned on, and closes a mechanical bypass switch in parallel with a series transformer.

The third duration is a duration in which the second current is greater than the preset current threshold.

Step H: If the second current is less than or equal to the preset current threshold, or if the second current is greater than the preset current threshold and the third duration is less than or equal to the first preset time threshold, the compensator maintains the output voltage of the series converter at zero.

Step I: The compensator acquires a voltage of a line corresponding to the first voltage to obtain a second voltage.

Step J: If the second voltage is greater than the preset voltage threshold, and the fourth duration is greater than the third preset time threshold, the compensator cancels setting the output voltage of the series converter to zero, and performs acquiring the current of the line connected to the compensator or the series converter in the compensator to obtain the first current.

Wherein, the fourth duration is a duration in which the second voltage is greater than the preset voltage threshold.

It should be noted that the description of the same steps or concepts in the other embodiments may be referred to in other embodiments, and details are not described herein again.

Figure 4:
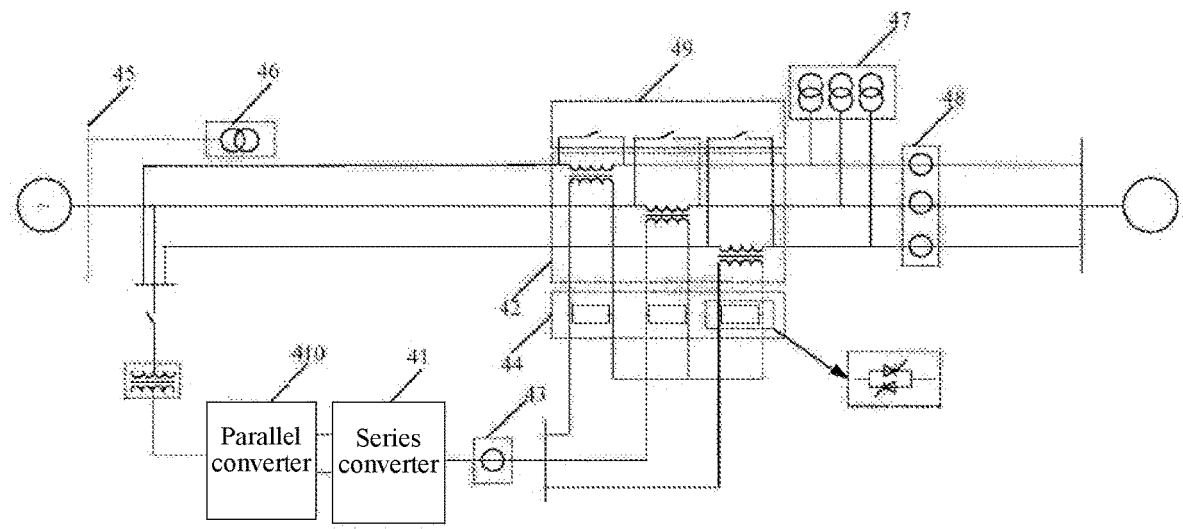
FIG. 4 is a schematic structural diagram of a UPFC according to an embodiment of the present invention.
Figure 5:
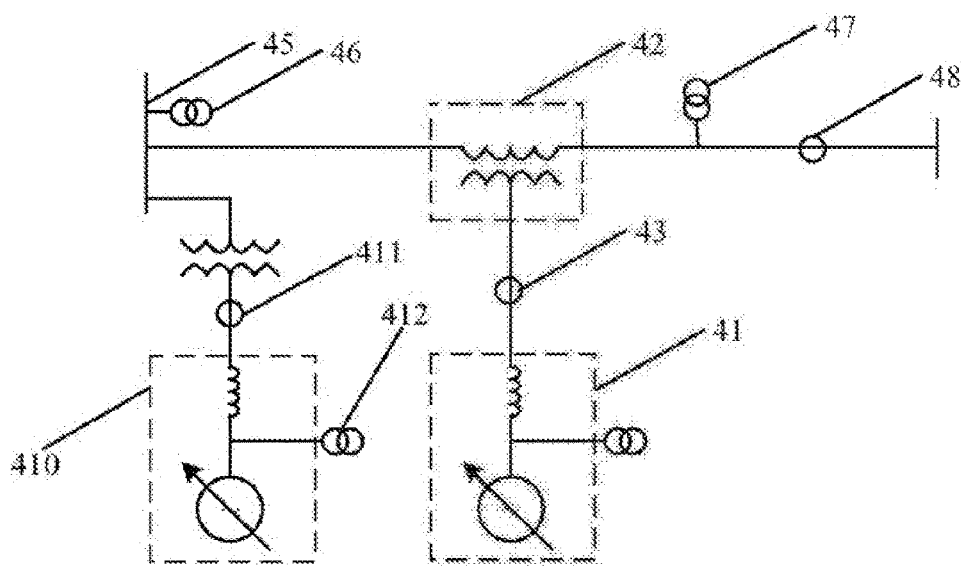
FIG. 5 is an equivalent diagram of a schematic structural diagram of a UPFC according to an embodiment of the present invention.
Figure 6:
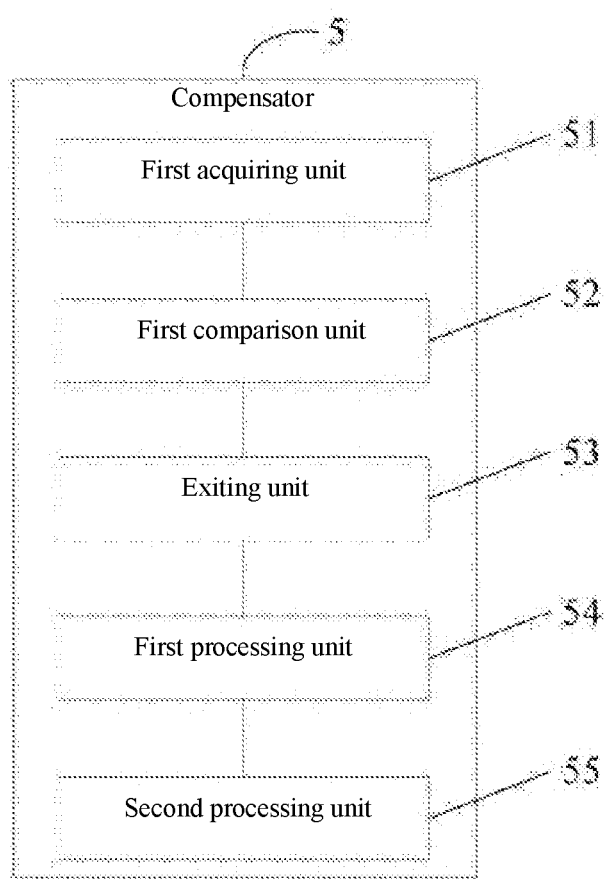
FIG. 6 is a schematic structural diagram of a compensator according to an embodiment of the present invention.

In the method, the circuit connection mode of the UPFC used in the above embodiment of the present invention can be referred to FIG. 4, and includes: a series converter 41, a series transformer 42, a current transformer 43 at output end of the series converter, a fast bypass switch 44, a bus 45 connected to the compensator, a bus voltage transformer 46, a voltage transformer 47 on the output side of the series transformer, and a current transformer 48 on the output side of the series transformer, a mechanical bypass switch 49, and a parallel converter 410. The basic structural equivalent diagram corresponding to FIG. 4 is shown in FIG. 5, wherein FIG. 5 further includes a current transformer 411 on the output side of the parallel converter and a voltage transformer 412 on the output side of the parallel converter. Specifically, the current transformer 43 at the output end of the series converter is used to obtain the current of the series converter, and the bus voltage transformer 46 is used to obtain the voltage of the bus 45 connected to the compensator, and the voltage transformer 47 on the output side of the series transformer is used to obtain the voltage of the line connected to the compensator, the current transformer 48 on the output side of the series transformer is used to obtain the current of the line connected to the compensator, and the current transformer 411 on the output side of the parallel converter is used to obtain the current of the parallel converter, the voltage transformer 412 on the output side of the parallel converter is used to obtain the voltage of the parallel converter. The fast bypass switch 44 is connected in parallel with the series transformer 42 and connected to the input side of the series transformer. The mechanical bypass switch 49 is also connected in parallel with the series transformer 42 and connected to the output side of the series transformer. The connection of the fast bypass switch 44 and the mechanical bypass switch 49 with the series transformer can be as shown in FIG. 4. It should be noted that the fast bypass switch 44 is connected in parallel with the series transformer 42 and is connected to the output end side of the series transformer, that is, connected in parallel with the mechanical bypass switch 49 on the output end side of the series transformer 42, which is not shown in FIG. 4.

The embodiment of the present invention provides a compensator 5, which can be applied to a method for suppressing the impact of a compensator on line distance protection provided by the embodiments corresponding to FIG. 1 to FIG. 4, and the compensator includes: the first acquiring unit 51, the first comparison unit 52, the exiting unit 53, the first processing unit 54, and the second processing unit 55, wherein:

The first acquiring unit 51 is configured to acquire a current of a line connected to the compensator or a series converter in the compensator to obtain a first current.

Wherein the compensator is used for controlling the current of the line connected to the compensator, and the compensator comprises a static synchronous series compensator, a unified power flow controller, an interline power flow controller and a convertible static compensator.

The first acquiring unit 51 is further configured to acquire a voltage of a bus connected to the compensator or the line connected to the compensator to obtain a first voltage if the first current is less than or equal to the preset current threshold, or if the first current is greater than the preset current threshold and the first duration is less than or equal to the first preset time threshold.

The first comparison unit 52 is configured to compare a relationship between the first current and the preset current threshold.

The first comparison unit 52 is further configured to compare a relationship between the first voltage and the preset voltage threshold.

The exiting unit 53 is configured to exit the series converter and the series transformer if the first current is greater than the preset current threshold and a first duration is greater than the first preset time threshold.

Wherein, the series transformer is a device in the compensator, the first duration is a duration in which the first current is greater than the preset current threshold, and the first preset time threshold is less than the first time; the first time is the sum of the time required for the line protection apparatus to analyze and calculate a distance protection I segment of the line connected to the compensator and a protection action delay time of the distance protection I segment; or the first preset time threshold is smaller than the difference between the first time and the response time for triggering the fast bypass switch.

The first acquiring unit 51 is further configured to acquire a voltage of a bus connected to the compensator or a line connected to the compensator to obtain the first voltage, if the first current is less than or equal to the preset current threshold, or if the first current is greater than the preset current threshold and the first duration is less than or equal to the first preset time threshold.

The first comparison unit 52 is further configured to compare a relationship between the first voltage and the preset voltage threshold.

The first processing unit 54 is configured to set an output voltage of the series converter to zero, and acquire a current of a component corresponding to the first current to obtain a second current, if the first voltage is less than or equal to the preset voltage threshold, and a second duration is greater than a second preset time threshold.

Wherein the second duration is a duration in which the first voltage is less than or equal to the preset voltage threshold.

The exiting unit 53 is further configured to exit the series converter and the series transformer if the second current is greater than the preset current threshold and the third duration is greater than the first preset time threshold.

Wherein the third duration is a duration in which the second current is greater than the preset current threshold.

The first acquiring unit 51 is further configured to acquire a voltage of a line corresponding to the first voltage to obtain a second voltage, if the second current is less than or equal to the preset current threshold, or if the second current is greater than the preset current threshold and the third duration is less than or equal to the first preset time threshold.

The second processing unit 55 is configured to cancel setting the output voltage of the series converter to zero and perform the acquiring of the current of the line connected to the compensator or the series converter in the compensator to obtain the first current, if the second voltage is greater than the preset voltage threshold, and a fourth duration is greater than the third preset time threshold.

Wherein, the fourth duration is a duration in which the second voltage is greater than the preset voltage threshold.

An apparatus for suppressing the impact of the compensator on the line distance protection is provided by the embodiment of the present invention, wherein the apparatus comprises: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Figure 7:
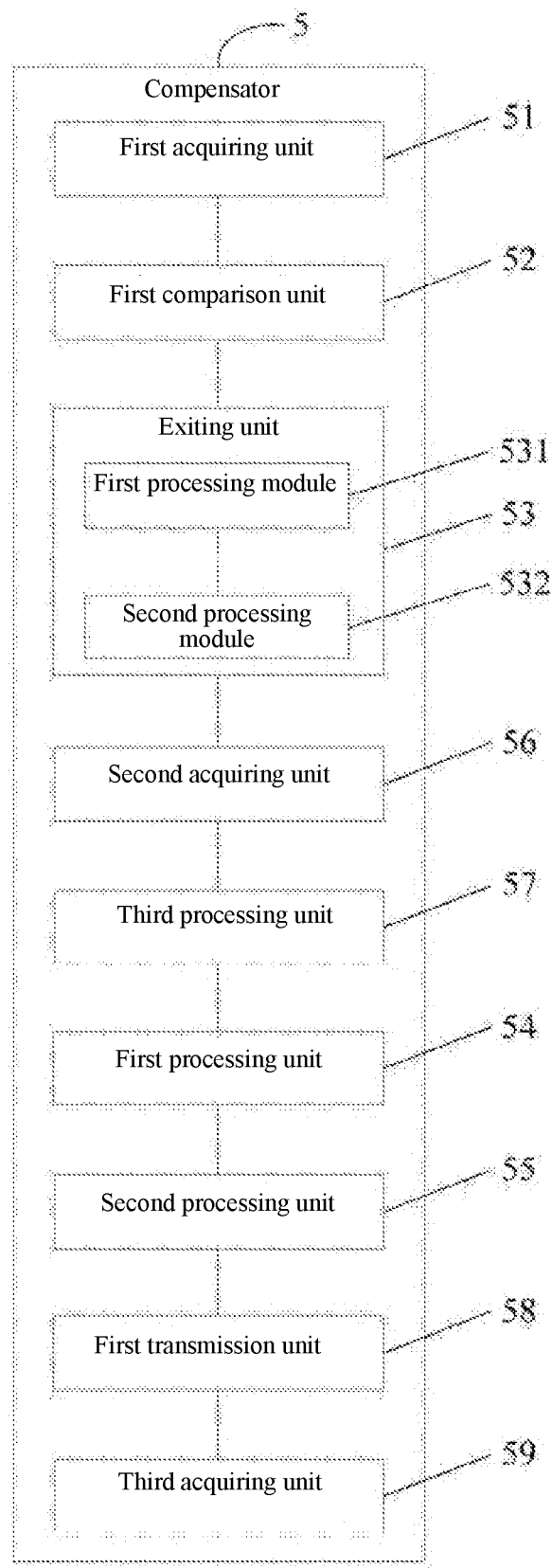
FIG. 7 is a schematic structural diagram of another compensator according to an embodiment of the present invention.

Specifically, referring to FIG. 7, the exiting unit 53 includes: a first processing module 531 and a second processing module 532, wherein:

The first processing module 531 is configured to lock the series converter and trigger the fast bypass switch in parallel with the series transformer to be turned on.

The second processing module 532 is configured to close the mechanical bypass switch if the series transformer is connected in parallel with the mechanical bypass switch.

Specifically, referring to FIG. 7, the exiting unit 53 further includes: a second acquiring unit 56 and a third processing unit 57, wherein:

The second acquiring unit 56 is configured to acquire current and voltage of the line connected to the compensator when the preset time comes.

The third processing unit 57 is configured to enable the series converter and the series transformer if the current of the line connected to the compensator is within a preset current range and the voltage of the line connected to the compensator is within a preset voltage range.

Specifically, referring to FIG. 7, the second processing unit 55 further includes: a first transmission unit 58 and a third acquiring unit 59, where:

The first transmission unit 58 is configured to send the first execution instruction to line protection apparatus when the second current is less than or equal to the preset current threshold, or if the second current is greater than the preset current threshold and the third duration is less than or equal to the first preset time threshold.

The line protection apparatus is configured to protect the line connected to the compensator, and the first execution instruction is used to instruct the line protection apparatus to update the distance protection impedance set value of the line connected to the compensator according to the first preset rule.

The third acquiring unit 59 is configured to start timing after the first execution instruction is sent, and acquire the second voltage after the preset time period.

The first transmission unit 58 is further configured to send the second execution instruction to the line protection apparatus when the second voltage is greater than the preset voltage threshold, and the fourth duration is greater than the third preset time threshold.

Wherein the second execution instruction is used to indicate the line protection apparatus to reset the distance protection impedance set value of the line connected to the compensator to a value before updating the distance protection impedance set value of the line connected to the compensator.

Figure 8:
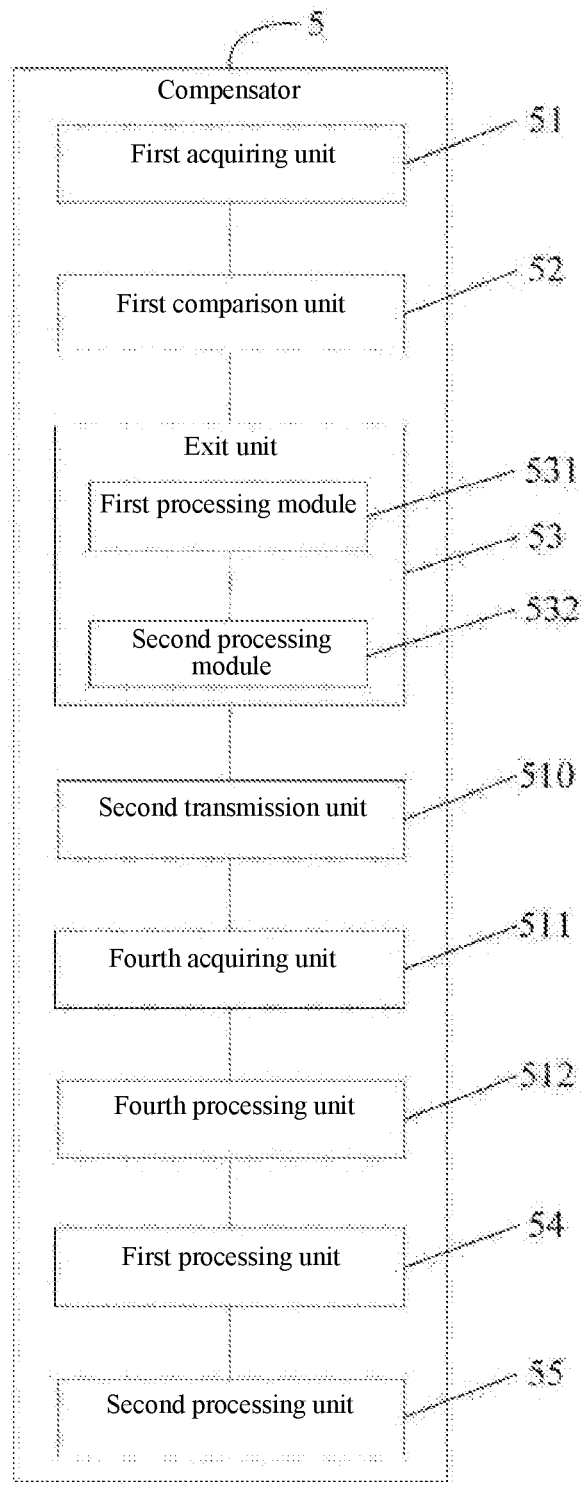
FIG. 8 is a schematic structural diagram of still another compensator according to an embodiment of the present invention.

Specifically, referring to FIG. 8, the exiting unit 53 further includes: a second transmission unit 510, a fourth acquiring unit 511, and a fourth processing unit 512, wherein:

The second transmission unit 510 is configured to send a third execution instruction to the line protection apparatus when the mechanical bypass switch is turned off.

Wherein the third execution instruction is used to instruct the line protection apparatus to update the distance protection impedance set value of the line connected to the compensator according to the second preset rule.

The fourth acquiring unit 510 is configured to start timing after the third execution instruction is sent, and obtain the current and voltage of the line connected to the compensator after the preset time period.

The fourth processing unit 512 is configured to enable the series converter and the series transformer if the current of the line connected to the compensator is within a preset current range and the voltage of the line connected to the compensator is within a preset voltage range.

The second transmission unit 510 is further configured to send a notification signal to the line protection apparatus when the mechanical bypass switch is closed.

Wherein the notification signal is used to notify the line protection apparatus to set the distance protection impedance of the line connected to the compensator to a value before updating the distance protection impedance set value of the line connected to the compensator.

It should be noted that, in the interaction process between each unit and module in this embodiment may be referred to the interaction process in the method for suppressing the impact of the compensator on the line distance protection provided by the embodiments corresponding to FIG. 1 to FIG. 3, details of which are not described herein again.

A compensator is provided by the embodiment of the present invention, performing the following steps: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Figure 9:
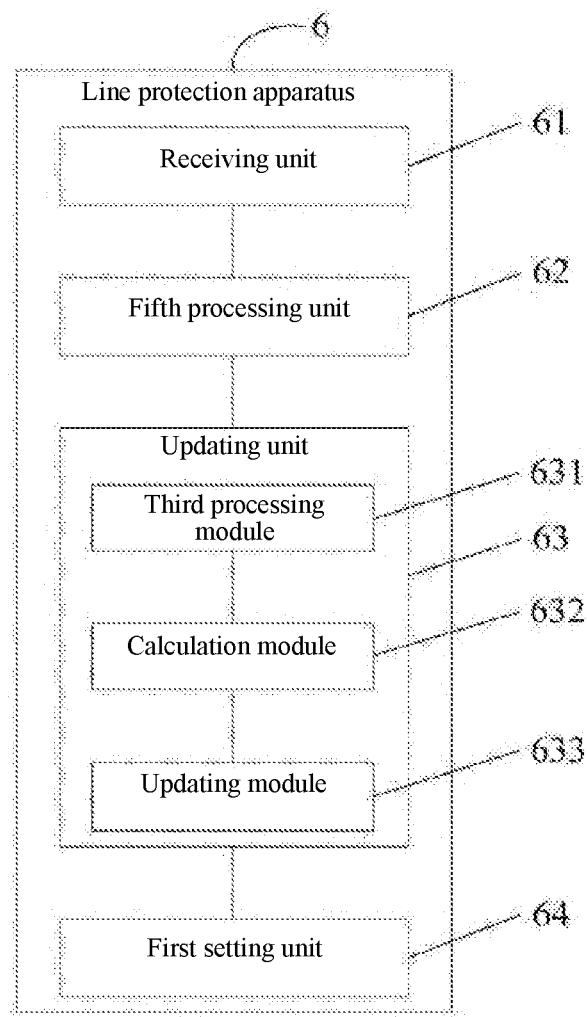
FIG. 9 is a schematic structural diagram of a line protection apparatus according to an embodiment of the present invention.

The embodiment of the present invention provides a line protection apparatus 6, which can be applied to a method for suppressing the impact of a compensator on the line distance protection provided by the foregoing embodiments. Referring to FIG. 9, the apparatus includes: a receiving unit 61, The fifth processing unit 62 and the updating unit 63, wherein:

The receiving unit 61 is configured to receive a first execution instruction sent by the compensator.

The fifth processing unit 62 is configured to obtain a distance protection impedance set value of the line connected to the compensator and set it to the first impedance in response to the first execution instruction.

The updating unit 63 is configured to update the distance protection impedance set value of the line connected to the compensator based on the first impedance and the first preset rule.

The receiving unit 61 is further configured to receive a second execution instruction sent by the compensator.

The fifth processing unit 62 is further configured to set the distance protection impedance set value of the line connected to the compensator to the first impedance in response to the second execution instruction.

Specifically, referring to FIG. 9, the update unit 63 includes: a third processing module 631, a calculation module 632, and an update module 633, wherein:

The third processing module 631 is configured to perform equivalent processing on the impedance of the series converter based on the impedance of the line side connected to the compensator to obtain a second impedance.

The calculating module 632 is further configured to add the first impedance, the second impedance, and the leakage reactance of the series transformer to obtain a third impedance.

The updating module 633 is further configured to update the distance protection impedance of the line connected to the compensator to a third impedance.

Specifically, referring to FIG. 9, the device further includes: a first setting unit 64, wherein:

The receiving unit 61 is further configured to receive a third execution instruction sent by the compensator.

The fifth processing unit 62 is further configured to add the first impedance to the leakage reactance of the series transformer to obtain a fourth impedance in response to the third execution instruction.

The first setting unit 64 is configured to set a distance protection impedance set value of the line connected to the compensator as the fourth impedance.

The receiving unit 61 is further configured to receive a notification signal sent by the compensator.

The fifth processing unit 62 is further configured to respond to the notification signal and set the distance protection impedance set value of the line connected to the compensator to the first impedance.

It should be noted that the interaction process between the units and the modules in this embodiment may be an interaction process in the method for suppressing the impact of the compensator on the line distance protection provided in the foregoing embodiments, and details are not described herein again.

The line protection apparatus provided by the embodiment of the present invention, after receiving the execution instruction sent by the compensator, performs an operation corresponding to the execution instruction in response to the execution instruction; thus, when the line protection apparatus operates, when the current of the line connected to the compensator or the series converter in compensator of the power system meets the preset condition, or when the current of the line connected to the compensator or the series converter in compensator of the power system does not meet the preset condition, but the voltage of the line connected to the compensator or the series converter in compensator of the power system meets the preset condition, and exiting the series converter and the series transformer, the line protection apparatus receives the execution instruction sent by the compensator, so that the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

Based on the foregoing embodiment, an embodiment of the present invention provides a compensator including: a detecting unit, a second comparison unit, a sixth processing unit, a second setting unit, a fifth acquiring unit, and a maintaining unit, wherein:

The detecting unit is configured to detect a current of the line connected to the compensator or the series converter in the compensator when the line connected to the compensator is working normally, to obtain a first current, and detect a voltage of a bus connected to the compensator or a line connected to the compensator to obtain the first voltage.

The second comparison unit is configured to compare a relationship between the first current and the preset current threshold.

The sixth processing unit is configured to lock the series converter and trigger the fast bypass switch connected in parallel with the series transformer to be turned on, and close a mechanical bypass switch connected in parallel with the series transformer, if the first current is greater than the preset current threshold, and a first duration is greater than the first preset time threshold.

Wherein the first duration is a duration in which the first current is greater than the preset current threshold.

The second comparison unit is further configured to compare a relationship between the first voltage and the preset voltage threshold if the first current is less than or equal to the preset a current threshold, or if the first current is greater than the preset current threshold and the first duration is less than or equal to the first preset time threshold.

The second setting unit is configured to set the output voltage of the series converter to be zero, if the first voltage is less than or equal to the preset voltage threshold, and a second duration is greater than the second preset time threshold.

Wherein the second duration is a duration in which the first voltage is less than or equal to the preset voltage threshold.

The fifth acquiring unit is configured to acquire a current of a component corresponding to the first current to obtain a second current.

The sixth processing unit is further configured to lock the series converter, trigger the fast bypass switch connected in parallel with the series transformer to be turned on, and close a mechanical bypass switch connected in parallel with the series transformer, if the second current is greater than the preset current threshold, and a third duration is greater than the first preset time threshold.

Wherein, the third duration is a duration in which the second current is greater than the preset current threshold.

The maintaining unit is configured to maintain the output voltage of the series converter at zero, if the second current is less than or equal to the preset a current threshold, or if the second current is greater than the preset current threshold and the third duration is less than or equal to the first preset time threshold, The fifth acquiring unit is further configured to acquire a voltage of the line corresponding to the first voltage to obtain a second voltage.

The sixth processing unit is further configured to cancel setting an output voltage of the series converter to be zero, and perform the acquiring of the current of the line connected to the compensator or the series converter in the compensator to obtain a first current, if the second voltage is greater than the preset voltage threshold, and a fourth duration is greater than the third preset time threshold.

The fourth duration is a duration in which the second voltage is greater than the preset voltage threshold.

It should be noted that, in the interaction process between the units and the modules in this embodiment, reference may be made to the interaction process in the method for suppressing the impact of the compensator on the line distance protection provided in the foregoing embodiment, and details are not described herein again.

The compensator provided by the embodiment of the present invention performing the following steps: acquiring a current of a line connected to a compensator or a series converter in a compensator to obtain a first current; acquiring a voltage of a bus connected to the compensator or a line connected to the compensator to obtain a first voltage; exiting the series converter and the series transformer if the first current is greater than the preset current threshold, and the first duration is greater than the first preset time threshold; setting the output voltage of the series converter to zero and continuing to acquire the current of the component corresponding to the first current to obtain the second current, if the first voltage is less than or equal to the preset voltage threshold and the second duration is greater than the second time threshold; exiting the series converter and the series transformer when the second current is greater than the preset current threshold and the third duration is greater than the first preset time threshold, otherwise acquiring a voltage of a line corresponding to the first voltage to obtain a second voltage when the second current does not satisfy the above condition; canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; thus, when the line protection apparatus working, exiting the series converter and the series transformer when the current of the line connected to the compensator or the series covert in the compensator used in the power system meets the preset condition, so that the series converter and the series transformer are not operated, and the impact of the operating characteristics of the series converter and the series transformer on the line protection apparatus are suppressed, which facilitates the control of the working state of the series converter and the series transformer in the compensator, and solves the problem of the impact on the protection performance of the line protection apparatus in the prior art, and ensures the performance of the line protection apparatus for distance protection of the line, ensures the safe and stable operation of the power system, and ensures the industrial applicability.

In an actual application, the first acquiring unit 51, the first comparison unit 52, the exiting unit 53, the first processing unit 54, the second processing unit 55, the second acquiring unit 56, the third processing unit 57, the first transmission unit 58, the third acquiring unit 59, the second transmission unit 510, the fourth acquiring unit 511, the fourth processing unit 512, the first processing module 531, the second processing module 532, the receiving unit 61, the fifth processing unit 62, the updating unit 63, the first setting unit 64, the third processing module 631, the calculation module 632, and the update module 633 may each be a Central Processing Unit (CPU) or a Micro Processor Unit (MPU) located in the wireless data transmitting device, Digital Signal Processor (DSP) or Field Programmable Gate Array (FPGA) located in a wireless data transmitting device.

Those skilled in the art will appreciate that embodiments of the present invention can be provided as a method, system, or computer program product. Accordingly, the present invention can take the form of a hardware embodiment, a software embodiment, or a combination of software and hardware. Moreover, the invention can take the form of a computer program product embodied on one or more computer-usable storage media (including but not limited to disk storage and optical storage, etc.) including computer usable program code.

The present invention has been described with reference to flowchart illustrations and/or block diagrams of methods, apparatus (system), and computer program products according to embodiments of the invention. It should be understood that each flow and/or block in a flowchart and/or block diagram, as well as the combination of the flow and/or block in a flowchart and/or block diagram, can be implemented by computer program instructions. These computer program instructions can be provided to processors of general purpose computers, dedicated computers, embedded processors, or other programmable data processing devices to generate a machine, and a device that generates instructions executed by a processor of a computer or other programmable data processing device to implement functions specified in one or more processes and/or block diagrams of a flow chart.

The computer program instructions can also be stored in a computer readable memory that can direct a computer or other programmable data processing device to operate in a particular manner, such that the instructions stored in the computer readable memory produce an article of manufacture comprising the instruction device. The instruction device implements the functions specified in one or more locks of a flow or a flow and/or lock diagram of the flowchart.

These computer program instructions can also be loaded onto a computer or other programmable data processing device such that a series of operational steps are performed on a computer or other programmable device to produce computer-implemented processing for execution on a computer or other programmable device. The instructions provide steps for implementing the functions specified in one or more of the flow or in a lock or locks of a flow diagram.

The above-mentioned is only the preferred embodiment of the present invention and is not intended to limit the scope of the present invention.

What is claimed is:

1. A method for suppressing an impact of a compensator on a line distance protection, characterized in that, the method comprising:

acquiring a current of a line connected to a compensator or a series converter in the compensator to obtain a first current; wherein the compensator is configured to control the current of the line connected to the compensator, the compensator comprising a static synchronous series compensator, a unified power flow controller, an interline power flow controller, and a convertible static compensator;

acquiring a voltage of a bus connected to the compensator or a voltage of the line connected to the compensator to obtain a first voltage;

comparing a relationship between the first current and a preset current threshold;

comparing a relationship between the first voltage and a preset voltage threshold;

exiting the series converter and a series transformer, if the first current is greater than the preset current threshold, and a first duration is greater than a first preset time threshold; wherein the series transformer is a device in the compensator, the first duration is a duration in which the first current is greater than the preset current threshold;

setting the output voltage of the series converter to zero, and acquiring the current of a component corresponding to the first current to obtain a second current, if the first voltage is less than or equal to the preset voltage threshold and a second duration is greater than the second preset time threshold; wherein the second duration is a duration in which the first voltage is less than or equal to the preset voltage threshold;

exiting the series converter and the series transformer if the second current is greater than the preset current threshold, and a third duration is greater than the first preset time threshold; wherein the third duration is a duration in which the second current is greater than the preset current threshold;

acquiring a voltage of a line corresponding to the first voltage to obtain a second voltage, if the second current is less than or equal to the preset current threshold, or if the second current is greater than the preset current threshold and the third duration is less than or equal to the first preset time threshold; and canceling the setting of the output voltage of the series converter to zero, and performing the acquiring of the current of the line connected to the compensator or the series converter in the compensator to obtain the first current, if the second voltage is greater than the preset voltage threshold, and a fourth duration is greater than the third preset time threshold; wherein the fourth duration is a duration in which the second voltage is greater than the duration of the preset voltage threshold.

2. The method according to claim 1, characterized in that, said exiting the series converter and the series transformer comprising:

locking the series converter and triggering a fast bypass to be turned on which in parallel with said series transformer ; and closing a mechanical bypass switch in parallel with the series transformer.

3. The method according to claim 1, characterized in that, further comprising the following steps after said exiting the series converter and the series transformer:

acquiring the current and voltage of the line connected to the compensator when a preset time comes; and enabling the series converter and the series transformer, if the current of the line connected to the compensator is within a preset current range, and the voltage of the line connected to the compensator is within a preset voltage range.

4. The method according to claim 1, characterized in that, further comprising the following steps after said acquiring the current of a component corresponding to the first current to obtain a second current:

sending a first execution instruction to a line protection apparatus if the second current is less than or equal to the preset current threshold, or if the second current is greater than the preset current threshold and the third duration is less than or equal to the first preset time threshold; wherein the line protection apparatus is configured to protect the line connected to the compensator, and the first execution instruction is used to instruct the line protection apparatus to update a set value of the distance protection impedance of the line connected to the compensator according to a first preset rule;

acquiring the second voltage after a preset time period from sending the first execution instruction; and sending a second execution instruction to the line protection apparatus if the second voltage is greater than the preset voltage threshold, and the fourth duration is greater than the third preset time threshold; wherein the second execution instruction is used to instruct the line protection apparatus to reset the set value of the distance protection impedance of the line connected to the compensator to a value before updating the set value of the distance protection impedance of the line connected to the compensator.

5. The method according to claim 1, characterized in that, further comprising the following steps after said exiting the series converter and the series transformer:

sending a third execution instruction to the line protection apparatus when the mechanical bypass switch is turned off; wherein the third execution instruction is used to instruct the line protection apparatus to update the set value of the distance protection impedance of the line connected to the compensator according to a second preset rule;

starting timing after sending the third execution instruction, after a preset duration, acquiring the current and voltage of the line connected to the compensator;

enabling the series converter and the series transformer if the current of the line connected to the compensator is within a preset current range, and the voltage of the line connected to the compensator is within a preset voltage range; and sending a notification signal to the line protection apparatus when the mechanical bypass switch is closed; wherein the notification signal is used to inform the line protection apparatus to reset the set value of the distance protection impedance of the line connected to the compensator to a value before updating the set value of the distance protection impedance of the line connected to the compensator.

6. The method according to claim 1, characterized in that, the first preset time threshold is less than a first time; wherein the first time is the sum of the time required for the line protection apparatus to analyze and calculate a distance protection (I) segment of the line connected to the compensator and a protection action delay time of the distance protection (I) segment; or the first preset time threshold is smaller than the difference between the first time and the response time for triggering the fast bypass switch.

7. A method for suppressing the impact of a compensator on line distance protection, characterized in that, the method comprising:
   receiving a first execution instruction sent by a compensator; and
   acquiring a set value of distance protection impedance of a line connected to the compensator in response to the first execution instruction and setting the set value to a first impedance;
   updating the set value of the distance protection impedance of the line connected to the compensator based on the first impedance and a first preset rule, comprising:
   performing an equivalent processing on the impedance of the series converter based on the impedance of the line side connected to the compensator to obtain a second impedance;
   adding the first impedance, the second impedance, and a leakage reactance of the series transformer to obtain a third impedance; and
   updating the set value of the distance protection impedance of the line connected to the compensator to the third impedance;
   receiving a second execution instruction sent by the compensator; and
   setting the set value of the distance protection impedance of the line connected to the compensator as the first impedance, in response to the second execution instruction.

8. The method according to claim 7, characterized in that, the method further comprising:
   receiving a third execution instruction sent by the compensator;
   adding the first impedance to a leakage reactance of the series transformer to obtain a fourth impedance in response to the third execution instruction;
   setting the set value of the distance protection impedance of the line connected to the compensator to the fourth impedance;
   receiving a notification signal sent by the compensator; and
   setting the set value of the distance protection impedance of the line connected to the compensator as the first impedance in response to the notification signal.

9. A method for suppressing an impact of a compensator on a line distance protection, characterized in that, the method comprising:
   detecting a current of the line connected to a compensator or a series converter in the compensator to obtain a first current, and a voltage of a line connected to a compensator or a series converter in the compensator to obtain a first voltage, when the line connected to the compensator is working normally;
   comparing a relationship between the first current and a preset current threshold; locking the series converter and triggering the fast bypass switch connected in parallel with the series transformer to be turned on, and closing a mechanical bypass switch connected in parallel with the series transformer, if the first current is greater than the preset current threshold, and a first duration is greater than the first preset time threshold; wherein the first duration is a duration in which the first current is greater than the preset current threshold;
   comparing a relationship between the first voltage and the preset voltage threshold if the first current is less than or equal to the preset a current threshold, or if the first current is greater than the preset current threshold and the first duration is less than or equal to the first preset time threshold;
   setting the output voltage of the series converter to be zero, if the first voltage is less than or equal to the preset voltage threshold, and a second duration is greater than the second preset time threshold; wherein the second duration is a duration in which the first voltage is less than or equal to the preset voltage threshold;
   acquiring a current of a component corresponding to the first current to obtain a second current;
   locking the series converter, triggering the fast bypass switch connected in parallel with the series transformer to be turned on, and closing a mechanical bypass switch connected in parallel with the series transformer, if the second current is greater than the preset current threshold, and a third duration is greater than the first preset time threshold; wherein the third duration is a duration in which the second current is greater than the preset current threshold; maintaining the output voltage of the series converter at zero, if the second current is less than or equal to the preset a current threshold, or if the second current is greater than the preset current threshold and the third duration is less than or equal to the first preset time threshold;
   acquiring a voltage of the line corresponding to the first voltage to obtain a second voltage; and
   canceling setting an output voltage of the series converter to be zero, and performing the acquiring of the current of the line connected to the compensator or the series converter in the compensator to obtain a first current, if the second voltage is greater than the preset voltage threshold, and a fourth duration is greater than the third preset time threshold; wherein the fourth duration is a duration in which the second voltage is greater than the preset voltage threshold.

10. A compensator, characterized in that, comprising: a first acquiring unit, a first comparison unit, an exiting unit, a first processing unit, and a second processing unit; wherein:
   the first acquiring unit configured to acquire a current of a line connected to the compensator or a series converter in the compensator to obtain a first current; wherein the compensator is used to control the current of the line connected to the compensator, the compensator comprising a static synchronous series compensator, a unified power flow controller, an interline power flow controller, and a convertible static compensator; the first acquiring unit further configured to acquire a voltage of a bus connected to the compensator or a line connected to the compensator to obtain the first voltage;
   the first comparison unit configured to compare a relationship between the first current and a preset current threshold;
   the first comparison unit further configured to compare a relationship between the first voltage and a preset voltage threshold;
   the exiting unit configured to exit the series converter and the series transformer if the first current is greater than the preset current threshold and a first duration is greater than the first preset time threshold, wherein the series transformer is a device in the compensator, the first duration is a duration in which the first current is greater than a first preset current threshold;

the first processing unit configured to set an output voltage of the series converter to zero, and acquire a current of a component corresponding to the first current to obtain a second current, if the first voltage is less than or equal to the preset voltage threshold, and a second duration is greater than a second preset time threshold; wherein the second duration is a duration that the first voltage is less than or equal to the preset voltage threshold;

the exiting unit further configured to exit the series converter and the series transformer if the second current is greater than the preset current threshold, and a third duration is greater than the first preset time threshold; wherein the third duration is a duration in which the second current is greater than the duration of the preset current threshold;

the first acquiring unit further configured to acquire a voltage of a line corresponding to the first voltage to obtain a second voltage, if the second current is less than or equal to the preset current threshold, or if the second current is greater than the preset current threshold and the third duration is less than or equal to the first preset time threshold; and the second processing unit configured to cancel setting the output voltage of the series converter to zero and perform the acquiring of the current of the line connected to the compensator or the series converter in the compensator to obtain the first current, if the second voltage is greater than the preset voltage threshold, and a fourth duration is greater than the third preset time threshold; wherein the fourth duration is a duration in which the second voltage is greater than the preset voltage threshold.

11. The compensator according to claim 10, characterized in that, the exiting unit comprising a first processing module and a second processing module; wherein:

the first processing module configured to lock the series converter and trigger the fast bypass switch connected in parallel with the series transformer to be turned on; and the second processing module configured to close a mechanical bypass switch if the series transformer is connected in parallel with the mechanical bypass switch.

12. The compensator according to claim 10, characterized in that, the exiting unit further comprising: a second acquiring unit and a third processing unit; wherein:

the second acquiring unit configured to acquire the current and voltage of the line connected to the compensator when the preset time comes; and the third processing unit configured to enable the series converter and the series transformer if the current of the line connected to the compensator is within a preset current range, and the voltage of the line connected to the compensator is within a preset voltage range.

13. The compensator according to claim 10, characterized in that, the second processing unit further comprising: a first transmission unit and a third acquiring unit; wherein:

the first transmission unit configured to send a first execution instruction to a line protection apparatus if the second current is less than or equal to the preset current threshold, or if the second current is greater than the preset current threshold and the third duration is less than or equal to the first preset time threshold; wherein the line protection apparatus is configured to protect the line connected to the compensator, and the first execution instruction is used to instruct the line protection apparatus to update a set value of the distance protection impedance of the line connected to the compensator according to a first preset rule;

the third acquiring unit configured to acquire the second voltage after a preset time period from sending the first execution instruction; and the first transmission unit further configured to send a second execution instruction to the line protection apparatus if the second voltage is greater than the preset voltage threshold, and the fourth duration is greater than the third preset time threshold; wherein the second execution instruction is used to instruct the line protection apparatus to reset the set value of the distance protection impedance of the line connected to the compensator to a value before updating the set value of the distance protection impedance of the line connected to the compensator.

14. The compensator according to claim 10, characterized in that, the exiting unit further comprising: a second transmission unit, a fourth acquiring unit, and a fourth processing unit; wherein:

the second transmission unit configured to send a third execution instruction to the line protection apparatus when the mechanical bypass switch is turned off; wherein the third execution instruction is used to instruct the line protection apparatus to update the set value of the distance protection impedance of the line connected to the compensator according to a second preset rule;

the fourth acquiring unit configured to start timing after sending the third execution instruction, after a preset duration, acquiring the current and voltage of the line connected to the compensator;

the fourth processing unit configured to enable the series converter and the series transformer if the current of the line connected to the compensator is within a preset current range, and the voltage of the line connected to the compensator is within a preset voltage range; and the second transmission unit further configured to send a notification signal to the line protection apparatus when the mechanical bypass switch is closed; wherein the notification signal is used to inform the line protection apparatus to reset the set value of the distance protection impedance of the line connected to the compensator to a value before updating the set value of the distance protection impedance of the line connected to the compensator.

15. The compensator according to claim 10, characterized in that:

the first preset time threshold is less than the first time; wherein the first time is the sum of the time required for the line protection apparatus to analyze and calculate a distance protection (I) segment of the line connected to the compensator and a protection action delay time of the distance protection (I) segment;

or, the first preset time threshold is smaller than the difference between the first time and the response time for triggering the fast bypass switch.

16. A line protection apparatus, characterized in that, comprising: a receiving unit, a fifth processing unit, and an updating unit; wherein:

the receiving unit configured to receive a first execution instruction sent by a compensator;

the fifth processing unit configured to acquire a set value of distance protection impedance of a line connected to the compensator in response to the first execution instruction and set it to a first impedance;

the updating unit configured to update the set value of the distance protection impedance of the line connected to the compensator based on the first impedance and a first preset rule; the receiving unit further configured to receive a second execution instruction sent by the compensator; and the fifth processing unit further configured to set the set value of the distance protection impedance of the line connected to the compensator as the first impedance, in response to the second execution instruction.

17. The apparatus according to claim 16, characterized in that, the updating unit comprising: a third processing module, a calculating module and an updating module; wherein:

the third processing module configured to perform an equivalent processing on the impedance of the series converter based on the impedance of the line side connected to the compensator to obtain a second impedance;

the calculating module configured to add the first impedance, the second impedance, and a leakage reactance of the series transformer to obtain a third impedance; and the updating module further configured to update the set value of the distance protection impedance of the line connected to the compensator to the third impedance.

18. The apparatus according to claim 16, characterized in that, the apparatus further comprising a first setting unit; wherein:

the receiving unit further configured to receive a third execution instruction sent by the compensator;

the fifth processing unit further configured to add the first impedance to a leakage reactance of the series transformer to obtain a fourth impedance in response to the third execution instruction;

the first setting unit configured to set the set value of the distance protection impedance of the line connected to the compensator to the fourth impedance;

the receiving unit further configured to receive a notification signal sent by the compensator; and the fifth processing unit further configured to set the set value of the distance protection impedance of the line connected to the compensator as the first impedance in response to the notification signal.

19. A compensator, characterized in that, comprising: a detecting unit, a second comparison unit, a sixth processing unit, a second setting unit, a fifth acquiring unit, and a maintaining unit; wherein:

the detecting unit configured to detect a current of a line connected to a compensator or a series converter in the compensator to obtain a first current, and a voltage of a line connected to a compensator or a series converter in the compensator to obtain a first voltage, when the line connected to the compensator is working normally;

the second comparison unit configured to compare a relationship between the first current and a preset current threshold;

the sixth processing unit configured to lock the series converter and trigger the fast bypass switch connected in parallel with the series transformer to be turned on, and close a mechanical bypass switch connected in parallel with the series transformer, if the first current is greater than the preset current threshold, and a first duration is greater than the first preset time threshold; wherein the first duration is a duration in which the first current is greater than the preset current threshold;

the second comparison unit further configured to compare a relationship between the first voltage and the preset voltage threshold if the first current is less than or equal to the preset a current threshold, or if the first current is greater than the preset current threshold and the first duration is less than or equal to the first preset time threshold;

the second setting unit is configured to set the output voltage of the series converter to be zero, if the first voltage is less than or equal to the preset voltage threshold, and a second duration is greater than the second preset time threshold; wherein the second duration is a duration in which the first voltage is less than or equal to the preset voltage threshold;

the fifth acquiring unit configured to acquire a current of a component corresponding to the first current to obtain a second current;

the sixth processing unit further configured to lock the series converter, trigger the fast bypass switch connected in parallel with the series transformer to be turned on, and close a mechanical bypass switch connected in parallel with the series transformer, if the second current is greater than the preset current threshold, and a third duration is greater than the first preset time threshold; wherein the third duration is a duration in which the second current is greater than the preset current threshold;

the maintaining unit configured to maintain the output voltage of the series converter at zero, if the second current is less than or equal to the preset a current threshold, or if the second current is greater than the preset current threshold and the third duration is less than or equal to the first preset time threshold;

the fifth acquiring unit configured to acquire a voltage of the line corresponding to the first voltage to obtain a second voltage; and the sixth processing unit further configured to cancel setting an output voltage of the series converter to be zero, and perform the acquiring of the current of the line connected to the compensator or the series converter in the compensator to obtain a first current, if the second voltage is greater than the preset voltage threshold, and a fourth duration is greater than the third preset time threshold; wherein the fourth duration is a duration in which the second voltage is greater than the preset voltage threshold.

* * * * *